United States Patent
Nakanelua et al.

(10) Patent No.: US 11,785,735 B2
(45) Date of Patent: Oct. 10, 2023

(54) INTELLIGENT CABLE PATCHING OF RACKS TO FACILITATE CABLE INSTALLATION

(71) Applicant: CyberSecure IPS, LLC, Prince Frederick, MD (US)

(72) Inventors: Bobby Nakanelua, Elizabethtown, KY (US); Scott Rye, Prince Frederick, MD (US); Stephen Sohn, Cummings, GA (US)

(73) Assignee: CyberSecure IPS, LLC, Prince Frederick, MD (US)

( * ) Notice: Subject to any disclaimer, the term of this patent is extended or adjusted under 35 U.S.C. 154(b) by 352 days.

(21) Appl. No.: 17/180,277

(22) Filed: Feb. 19, 2021

(65) Prior Publication Data
US 2022/0272862 A1    Aug. 25, 2022

(51) Int. Cl.
*H05K 7/14*        (2006.01)
*G06N 3/08*        (2023.01)

(52) U.S. Cl.
CPC ............. *H05K 7/1491* (2013.01); *G06N 3/08* (2013.01); *H05K 7/1487* (2013.01); *H05K 7/1492* (2013.01)

(58) Field of Classification Search
CPC ........ G06N 3/08; G06N 3/084; H05K 7/1487; H05K 7/1491; H05K 7/1492; H05K 7/1498
See application file for complete search history.

(56) References Cited

U.S. PATENT DOCUMENTS

| | | | |
|---|---|---|---|
| 2018/0027312 A1* | 1/2018 | Adiletta | H04L 43/0876 398/45 |
| 2019/0044849 A1* | 2/2019 | Ganguli | G06F 9/5088 |
| 2019/0045370 A1* | 2/2019 | Al-Fanek | H04W 24/02 |
| 2019/0068521 A1* | 2/2019 | Kumar | G06F 11/3442 |
| 2019/0385057 A1* | 12/2019 | Litichever | H04L 63/14 |
| 2020/0103894 A1* | 4/2020 | Celia | G05B 23/0264 |
| 2020/0110454 A1* | 4/2020 | Yang | G06N 3/08 |
| 2020/0133257 A1* | 4/2020 | Celia | G05B 19/4183 |

(Continued)

OTHER PUBLICATIONS

Raghid Hikmat Morcel, "Distributed Fpga-Based Acceleration of Big Data Analytics in the Data Center Environment," Sep. 2018, Dessertation for American University of Beirut, pp. 10-30.*

(Continued)

*Primary Examiner* — Omar S Ismail
(74) *Attorney, Agent, or Firm* — Perkins Coie LLP

(57) ABSTRACT

In certain embodiments, cable patching may be facilitated. For example, identifiers corresponding to available ports for devices or objects within racks and required ports for patching devices into the racks may be determined. Cable patching schemes for the racks may be retrieved from sensors. The available ports, the required ports, and the cable patching schemes may be input into a prediction model, the prediction model being configured based on the inputs. New identifiers corresponding to new available ports for a new rack and new required ports for patching new devices into the new rack may be determined. A predicted cable patching scheme for patching the new rack may be obtained from the prediction model. In some embodiments, the predicted cable patching scheme may be transmitted to a user device.

20 Claims, 13 Drawing Sheets

(56) References Cited

U.S. PATENT DOCUMENTS

2020/0137918 A1* 4/2020 Takisaki ................. G06V 20/10
2020/0202196 A1* 6/2020 Guo ....................... G06N 3/042
2020/0348662 A1* 11/2020 Cella .................. G05B 23/0286
2022/0076066 A1* 3/2022 Forgeat ................. G06F 18/214

OTHER PUBLICATIONS

Emilio Ancillotti,"The role of communication systems in smart grids: Architectures, technical solutions and research challenges," Sep. 19, 2013, Computer Communications 36 (2013),pp. 1665-1690.*

Jun Sawada,"TrueNorth Ecosystem for Brain-Inspired Computing: Scalable Systems, Software, and Applications," Mar. 16, 2017, SC '16: Proceedings of the International Conference for High Performance Computing, Networking, Storage and Analysis,pp. 130-137.*

* cited by examiner

| First Side 902 | | | Cable Assembly 904 | Second Side 906 | | |
|---|---|---|---|---|---|---|
| Rack ID: 908<br>Rack Type: 910 | | | Cable ID: 912<br>Cable Type: 914 | Rack ID: 916<br>Rack Type: 918 | | |
| Device | Interface | Tail | | Tail | Interface | Device |
| 922 | 928 | 934 | | 940 | 946 | 952 |
| 924 | 930 | 936 | | 942 | 948 | 954 |
| 926 | 932 | 938 | | 944 | 950 | 956 |

INTELLIGENT CABLE PATCHING OF RACKS TO FACILITATE CABLE INSTALLATION

FIELD OF USE

This disclosure relates to facilitating cable installation by training a machine learning model to predict cable patching schemes for racks within an infrastructure.

BACKGROUND

Over the last decade datacenters have become larger and larger and may house tens of thousands of racks. These racks need power, networking, and other types of connections. Currently, racks are cabled and patched manually, requiring a large amount of planning and manual configuration. This configuration can be time-consuming and is prone to human error and other issues.

SUMMARY

Aspects of the current disclosure relate to methods, apparatuses, and/or systems for improving cable installation by using automatic mapping processes and utilizing metrics to determine optimal cable placement and rack connections. The disclosed processes use data structure generation and utilization metric generation for racks within an infrastructure (e.g., a datacenter, or a portion of a datacenter), improving cable routing between racks within the infrastructure, and also improving cable patching for racks within the infrastructure.

In some embodiments, the disclosed improvements rely on data structure generation. For example, data structure generation enables sharing data with cable installation systems later used to determine cable routes and patching of racks. Data structure generation is typically handled via manual data entry, which leads to input error and is inefficient. By using the templated data structure generation methods described herein, the cable installation system may significantly reduce data entry and manual input error and may ensure standardization. The increased accuracy of the resulting data structures improves the accuracy of all systems that rely on the data structures, such as cable routing systems and cable patching systems. For example, cable routing systems rely on the information stored in the data structures to determine optimal and diverse routes between racks. Additionally, cable patching systems rely on the information stored in the data structures to recommend optimal patching schemes for patching racks. The data structure generation improvements described thus improve the accuracy and efficiency of every step of the cable installation process.

In some embodiments, the current disclosure describes improvements to cable routing between racks (e.g., fiberoptic cables, network cables, power cables, or other suitable cable types). While conventional systems may track connections between racks, the systems and methods described herein utilize information stored within data structures to define and apply rules for routing cables. The accuracy of the data structures enables the cable routing system. Based on the rules, the cable routing system may automatically generate and measure optimal and diverse routes between racks. Finally, the cable routing system may generate cable designs for cables required for the determined routes and may cause the required cables to be manufactured. Thus, the cable routing system may significantly reduce the design and engineering time associated with routing new cables through an infrastructure (e.g., between racks or within racks). As a result of the cable routing improvements described herein, the required cables may be routed and installed more efficiently and without errors.

In addition, the current disclosure describes improvements to cable patching of racks. For example, a cable patching system may retrieve information about the racks and the infrastructure from one or more data structures. Additionally, the cable patching system may analyze how racks within an infrastructure have been cabled and therefore rely on the accuracy of the cable routing system. Unlike conventional cable patching systems, which rely on manual determination and input of patching schemes, the cable patching system described herein learns optimal cable patching schemes for racks based on the information about the racks and the infrastructure and how the racks are connected via cables. The cable patching system may recommend optimal patching schemes based on a combination of the aforementioned data.

Various other aspects, features, and advantages of the invention will be apparent through the detailed description of the invention and the drawings attached hereto. It is also to be understood that both the foregoing general description and the following detailed description are examples and not restrictive of the scope of the invention. As used in the specification and in the claims, the singular forms of "a," "an," and "the" include plural referents unless the context clearly dictates otherwise. In addition, as used in the specification and the claims, the term "or" means "and/or" unless the context clearly dictates otherwise.

DETAILED DESCRIPTION OF THE INVENTION

In the following description, for the purposes of explanation, numerous specific details are set forth in order to provide a thorough understanding of the embodiments of the invention. It will be appreciated, however, by those having skill in the art that the embodiments of the invention may be practiced without these specific details or with an equivalent arrangement. In other cases, well-known structures and devices are shown in block diagram form in order to avoid unnecessarily obscuring the embodiments of the invention.

Figure 1:
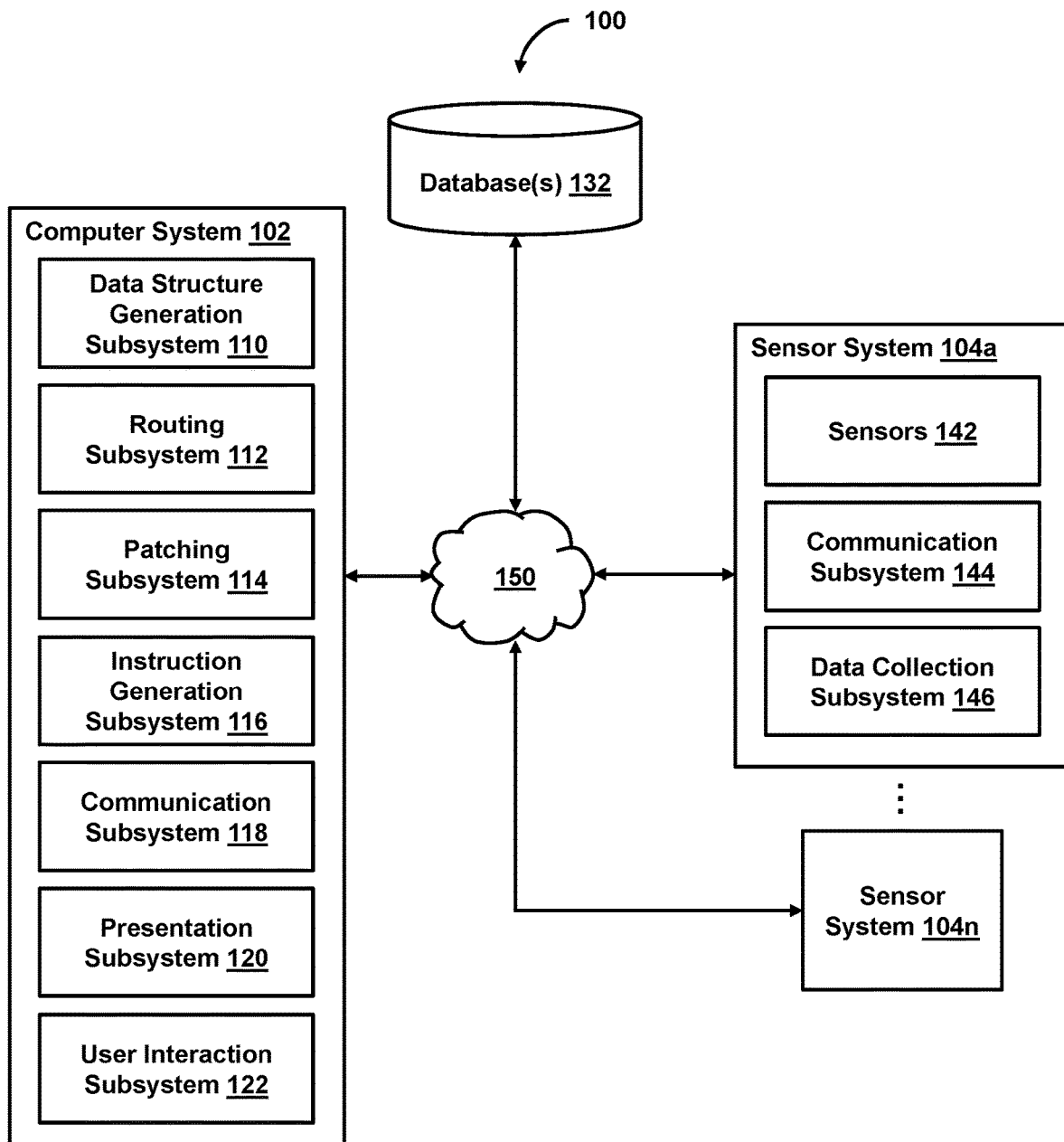
FIG. 1 shows a system for facilitating cable installation, in accordance with one or more embodiments.

One aspect of the disclosure relates to a system or method for generating data structures and utilization metrics for racks to facilitate cable installation within an infrastructure. For example, FIG. 1 shows a system 100 for facilitating cable installation, in accordance with one or more embodiments. In some embodiments, the system 100 may retrieve device templates for racks and objects associated with the racks in the infrastructure. For example, the device templates may facilitate generation of data structures using identifier information, interface information, and patch reference information. In addition, system 100 may receive rack data for the racks and object data for the associated objects. For example, system 100 may receive the rack data and the object data from one or more sensors within the infrastructure. The rack data and the object data may include the identifier information, the interface information, and the patch reference information. System 100 may also generate rack data structures and object data structures based on the device templates, their rack data, and the object data. Furthermore, System 100 may generate links between the rack data structures and the object data structures based on physical connections between the racks and the associated objects within the infrastructure and may monitor the physical connections over time updating the links based on changes to the physical connections.

In some embodiments, system 100 may generate utilization metrics for the rack data structures and the object data structures based on the updated links and the interface information. For example, the utilization metrics may include available interfaces and occupied interfaces, and the utilization metrics may indicate locations for additional physical connections. In some embodiments, system 100 may generate cable installation instructions including the locations for the additional connections based on the rack data structures, the object data structures, and the utilization metrics. In some embodiments, system 100 may cause a cable installation machine to install cables within the infrastructure according to the cable installation instructions.

Another aspect of the disclosure relates to facilitating cable routing between racks within an infrastructure. For example, system 100 may receive a selection of a first rack and a second rack within the infrastructure and may generate a primary cable route between the first rack and the second rack for a primary master cable. The primary cable route may be an optimal route between the first rack and the second rack, and the primary cable route may have a primary cable route length. In addition, system 100 may retrieve diversity requirements of the infrastructure. The diversity requirements may include a required number of secondary cable rounds between the first rack and the second rack for secondary master cables and required attributes of the secondary cable routes between the first rack and the second rack. System 100 may generate, based on the diversity requirements, the secondary cable routes between the first rack and the second rack. The secondary cable routes may have secondary cable route lengths. Furthermore, system 100 may retrieve a first set of cable patching rules for patching the first rack and a second set of cable patching rules for patching the second rack. For example, the first set of cable patching rules and the second set of cable patching rules may indicate cable type requirements for patching the first rack and the second rack, respectively. System 100 may determine, based on the first set of cable patching rules, a first patching scheme for the first rack. The first patching scheme may include the first patching length for a cable and a first cable type. System 100 may determine, based on the second set of cable patching rules, a second patching scheme for the second rack. The second patching scheme may include a second patching length for a cable and a second cable type. System 100 may cause a cable retrieval system to retrieve, from a cable supply, cables of appropriate length based on the patching schemes. For example, the cable retrieval system may retrieve cable segments of the primary cable route length for the primary master cable, the secondary cable route lengths for the secondary master cables, the first patching length of the first cable type, and the second patching length of the second cable type.

Another aspect of the disclosure relates to a system or method for facilitating cable patching, for example, via a neural network. System 100 may receive a first rack type for a first rack and a first set of cable patching codes for one or more devices to be patched into the first rack. System 100 may determine, based on the first rack type and the first set of cable patching codes, a first set of identifiers corresponding to available ports for devices or objects located in the first rack and the first set of ports required for patching the one or more devices. System 100 may generate a first vector that includes the first set of identifiers and the first set of ports. System 100 may input the first vector into a prediction model, such as a neural network, and receive, from the prediction model, a first predicted cable patching scheme for patching the one or more devices into the first rack. In some embodiments, the neural network may process the first vector to generate the first predicted cable patching scheme. In addition, system 100 may retrieve, from one or more sensors, a first cable patching scheme for the first rack, and provide the first cable patching scheme as reference feedback to the prediction model, causing the prediction model to be trained based on an assessment of the first predicted cable patching scheme against the first cable patching scheme. In some embodiments, system 100 may generate a second vector including a second set of identifiers and a second set of ports for a second rack. System 100 may input the second vector into the prediction model and receive, from the prediction model, a second predicted cable patching scheme for patching the second rack. The prediction model may determine the second predicted cable patching scheme based on the second vector, and may transmit, to a user device, the second predicted cable patching scheme for patching the second rack.

These processes may be used individually or in conjunction with each other and with any other processes for facilitating cable installation. For example, in some embodiments, system 100 may generate data structures for racks and objects that include cable patching codes. The cable patching codes may include information about what type of objects are in a rack and may allow system 100 to identify ports that are required for patching one or more devices associated with a rack. System 100 may further generate cable patching rules for cable routes within the infrastructure. For example, the cable patching rules may include logic for determining when and where patching cables may be added. System 100 may then use the cable patching codes and the cable patching rules to more efficiently determine a patching scheme for a new rack. For example, system 100 may retrieve the cable patching codes from one or more data structures (e.g., mentioned above) and may apply the cable patching rules to automatically and intelligently determine a patching scheme. Other examples may likewise use the methods described herein in conjunction with each other or with any other methods for improving cable installation.

As shown in FIG. 1, system 100 may include computer system 102, sensor system 104*a* (or sensor systems 104*a*-104*n*), database 132, and/or other components. Computer system 102 may include data structure generation subsystem 110, routing subsystem 112, patching subsystem 114, instruction generation subsystem 116, communication subsystem 118, presentation subsystem 120, user interaction subsystem 122, and/or other components. Sensor system 104*a* may include sensors 142, communication subsystem 144, data collection subsystem 146, or other components. In some embodiments, computer system 102 may be any type of mobile terminal, fixed terminal, or other device. By way of example, computer system 102 may include a desktop computer, a notebook computer, a tablet computer, a smartphone, a wearable device, a device on the cloud (e.g., a server), or another suitable device. It should be noted that, while one or more operations are described herein as being performed by particular components of computer system 102, those operations may, in some embodiments, be performed by other components of computer system 102 or other components of system 100. As an example, while one or more operations are described herein as being performed by components of computer system 102, those operations may, in some embodiments, be performed by components of sensor system 104*a* or other components of system 100 and while one or more operations are described herein as being performed by components of sensor system 104*a*, those operations may, in some embodiments, be performed by components of computer system 102 or other components of system 100.

Data Structure and Utilization Metric Generation

In some embodiments, system 100 may facilitate generation of data structures and utilization metrics for racks. In some embodiments, system 100 may facilitate cable installation.

Computer system 102 (e.g., data structure generation subsystem 110) may retrieve or define device templates for racks and associated objects within an infrastructure. Data structure generation subsystem 110 may receive rack data for the racks and object data for the associated objects (e.g., from one or more sensors within the infrastructure). Data structure generation subsystem 110 may generate rack data structures and object data structures based on the device templates, the rack data, and the object data. Data structure generation subsystem 110 may generate links between the racks data structures and the object data structures based on physical connections between the racks and the associated objects and may update the links based on any changes to the physical connections over time. Data structure generation subsystem 110 may generate utilization metrics for the rack data structures and the object data structures. For example, the utilization metrics may be based on the updated links and interface information for the racks and associated objects. The utilization metrics may indicate locations for additional physical connections based on available and occupied interfaces of the racks and associated objects. Computer system 102 (e.g., via instruction generation subsystem 116) may generate cable installation instructions based on the rack data structures, the object data structures, and the utilization metrics. The cable installation instructions may include the locations for the additional physical connections. Instruction generation subsystem 116 may transmit the cable installation instructions to a cable installation system to cause the cables to be installed.

Data structure generation subsystem 110 may define device templates for devices within an infrastructure. For example, data structure generation subsystem 110 may define device templates for devices that exist within the infrastructure, such as racks, routers, network switches, servers, patch panels, or other devices. In some embodiments, the device templates may themselves be data structures. For example, the device templates may be empty data structures (e.g., not populated with values) that are used to generate new data structures. In another example, the device templates may be data structures populated with default or null values. Data structure generation subsystem 110 may retrieve device templates that have already been defined (e.g., from database 132). In some embodiments, the device templates may be replicated and modified to generate data structures. Data structure generation subsystem 110 may build rack data structures and object data structures based on the device templates and may utilize the information in the generated data structures to facilitate cable installation.

The device templates may include fields having field identifiers. The fields may include identifier information, interface information, patch reference information, and other information. For example, a rack template may include fields labelled as Rack ID, Rack Type, Rack Location, Rack Interfaces, Rack Links, Rack Utilization, Rack Diagram, or other fields. In some embodiments, an object template (e.g., for a router, network switch, server, patch panel, or other object) may include fields labeled as Object ID, Object Location, Object Interfaces, Object Pairings, Cable Patching Codes, or other fields. Each field may allow for multiple values, and certain fields may include subsystem-fields. For example, a rack template may include Rack Height as a sub-field of Rack Location and Rack Model as a sub-field of Rack Type. In another example, an object template may accept multiple values for Object Interfaces. Each field may stipulate certain attributes or parameters of the data that may populate that field. For example, a Rack Location field may only be populated by values having a particular format (e.g., a format specific to the infrastructure, the client, or another specification). In some embodiments, a Rack Utilization field may only be populated by values between zero and one hundred. Other parameters may exist for the fields of the device templates.

In some embodiments, the field identifiers may correspond to data identifiers that exist within the system (e.g., for a particular software, for a particular client, or for some other system). For example, field identifiers matching the data identifiers (e.g., RackID, PatchReferenceCode, etc.) may be stored within the template. This may allow data structure generation subsystem 110 to identify the data that corresponds with each field. The device templates may further include computer instructions for generating data structures using identifier information, interface information, and patch reference information. Data structure generation subsystem 110 may generate the data structures based on the templates. Data structure generation subsystem 110 may utilize the generated data structures to facilitate cable installation.

The device templates may include additional fields for customer specific attributes. For example, the device templates may specify a type of service that each device delivers and the person or team responsible for the management of each rack. Additionally, the device templates may be modified to match specific customer terminology or codes. For example, the fields of the device templates may be modified to match customer labels and product names. In some embodiments, the formatting of the fields may be modified to accept customer-specific codes and names.

Data structure generation subsystem 110 may group device templates together to specify objects that will be installed within a rack. For example, data structure generation subsystem 110 may group a rack data structure for a parent rack with object data structures for objects (e.g., routers, switches, servers, or other objects) that will be installed within the rack. The grouping may allow data structure generation subsystem 110 to build the data structures for the grouping and ensure that the data structures capture the relationships between all components within the rack. The system may use the resulting data structures to facilitate cable installation.

Rack templates may include additional properties or attributes. For example, the rack templates may include classifications. For example, in additional to including a Rack Type within the data structure, the rack template itself may vary depending on the classification of the rack. Therefore, rack templates may be selected specifically for racks based on classification information. Rack templates may form data structures that are capable of accepting logic. For example, rack templates may build rack data structures having programmable logic fields that may be programmed by a user at later times. This allows data structure generation subsystem 110 to build dynamic data structures that may adapt to changing circumstances and rules. The system may update the resulting data structures with logic and may utilize the updated data structures to facilitate cable installation.

After retrieving the device templates (e.g., rack templates and object templates), data structure generation subsystem 110 may generate data structures based on the templates and data relating to the devices. For example, data structure generation subsystem 110 may receive data from sensors within the infrastructure (e.g., sensors 142) or a data collection system within the infrastructure (e.g., data collection subsystem 146). In some embodiments, sensors 142 may be cameras, scanners, scales, or other sensors. Sensors 142 may gather data by taking photographs or videos, by scanning tags or labels (e.g., via radio frequency transmission, such as Bluetooth, RFID, or NFC), capturing a weight, or in another manner. Sensors 142 within the infrastructure may transmit the captured data to a central server or computer system (e.g., computer system 102). The captured data may include identifier information, interface information, and patch reference information associated with racks and objects within the infrastructure. Data structure generation subsystem 110 may then receive the device data and may identify, within the device data, values corresponding to field identifiers within the device template. For example, data structure generation subsystem 110 may identify data based on a particular format (e.g., how many letters, numbers, hyphens, or other characters make up the value or how the letters, numbers, hyphens, or other characters are arranged). The retrieved data may include identifiers that specify the type of data. Data structure generation subsystem 110 may identify the received data based on these or other methods. Data structure generation subsystem 110 may utilize the retrieved data to build data structures for facilitating cable installation.

After retrieving the device templates and receiving the device data, data structure generation subsystem 110 may build rack data structures and object data structures based on the device templates. To build the data structures based on the templates, data structure generation subsystem 110 may recreate the device templates with populated or updated fields. For example, data structure generation subsystem 110 may recreate a device template having empty fields or fields populated with default values and may add or replace values of the fields. Data structure generation subsystem 110 may determine the values for the fields based on the field identifiers (e.g., DeviceName, PatchingCode, etc.). For example, data structure generation subsystem 110 may identify, within the rack data and the object data, a value corresponding to each field of the device template. Data structure generation subsystem 110 may link the values and the fields of the device templates. This may assist data structure generation subsystem 110 in associating the values with the correct fields during data structure generation. Data structure generation subsystem 110 may then generate rack data structures and object data structures using the device templates, the rack data, and the object data.

Figure 2A:
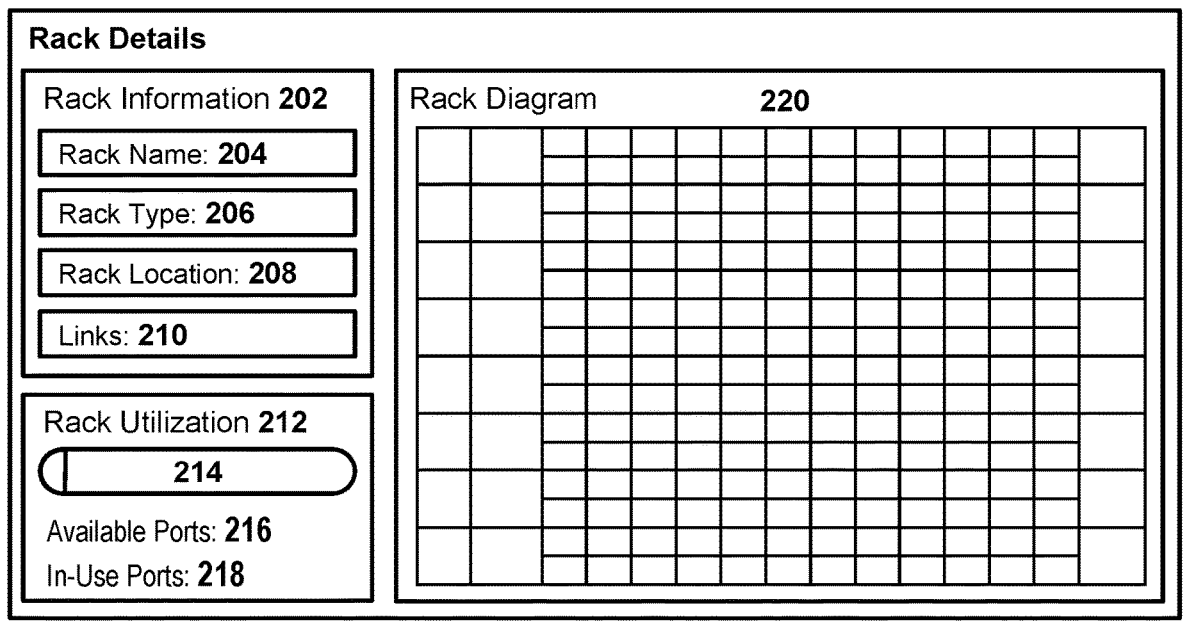
FIGS. 2A and 2B show a rack data structure and an object data structure, in accordance with one or more embodiments.
Figure 2B:
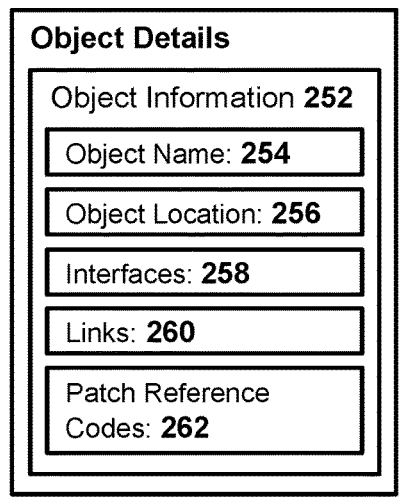

After retrieving the device templates and receiving the device data, data structure generation subsystem 110 may build rack data structures and object data structures based on the device templates. For example, FIGS. 2A and 2B show a rack data structure 200 and an object data structure 250, in accordance with one or more embodiments. In some embodiments, rack data structure 200 and object data structure 250 may be data structure templates, for example, with empty fields or default values, as described above. Rack data structure 200 and object data structure 250 may be completed data structures, for example, with values based on rack data and object data retrieved from sensors within the infrastructure (e.g., sensors 142, as shown in FIG. 1).

Rack data structure 200 may include rack information 202 that is based on received rack data. For example, rack name 204 may be a name, number, code, or other identifier of a rack within the infrastructure. Rack type 206 may indicate a type of service that the rack delivers (e.g., server rack, patch rack, etc.). Rack location 208 may specify a location of the rack within the infrastructure. For example, rack location 208 may include an address, GPS coordinates, map coordinates (e.g., F3), or another location indicator. Rack location 208 may include words, numbers, codes, or other information to specify where the rack is located. Object data structure 250 may include object information 252 that is based on received object data. For example, object name 254 may be an identifier, such as a name, number, code, or other identifier of a rack within the infrastructure. Object location 256 may specify a location of the object within the infrastructure. For example, object location 256 may include an address, GPS coordinates, map coordinates (e.g., F3), or another location indicator. Object location 256 may include words, numbers, codes, or other information to specify where the object is located. Object information 252 may further include interfaces 258. For example, interfaces 258 may include ports and port information, such as port type and port availability.

Data structure generation subsystem 110 may generate data structures that include graphical displays. For example, rack diagram 220 may be a graphical display of the rack within the system. For example, rack diagram 220 may include devices within the rack and interfaces of the devices. Rack diagram 220 may indicate which ports are in use, available, physically connected but not in use, or other port statuses. For example, rack diagram 220 may display the ports in different colors to indicate the status of each port. Rack diagram 220 may be interactive. For example, rack diagram 220 may be displayed to the user via presentation subsystem 120, as shown in FIG. 1. The user may interact with the diagram, via user interaction subsystem 122. For example, the user may select an object within rack diagram 220 to view data about the object. The user may select individual interfaces or ports from rack diagram 220 to view information about the interfaces (e.g., types of interfaces, connections at the interfaces, availability of the interfaces, etc.). In some embodiments, interactions with rack diagram 220 may cause other data structures (e.g., object data structures) to be displayed. For example, in response to a user interaction (e.g., via user interaction subsystem 122) with other information (e.g., available ports 216), data structure generation subsystem 110 may cause various portions of rack diagram 220 to become visually altered (e.g., highlighted, bolded, different color, or some other alteration). Rack diagram 220 may include additional information about the rack. Data structure generation subsystem 110 may use graphical displays within the data structures to facilitate cable installation.

In some embodiments, data structure generation subsystem 110 may generate data structures that include cable patching codes. For example, cable patching codes may assist computer system 102 in understanding what type of object is in each rack. For example, cable patching codes may designate an object as a router, a network switch, or another object. Cable patching codes may designate interfaces on an object (e.g., an interface on a router, an interface on a network switch, or another interface). Cable patching codes may be used to determine or suggest connections with the objects or the interfaces. Data structure generation subsystem 110 may generate object data structures that include the cable patching codes. For example, as shown in FIG. 2B, object information 252 includes cable patching codes 262. Cable patching codes may be determined by data structure generation subsystem 110 and included in object data structure 250 based on the object data gathered from sensors within the infrastructure. For example, sensors may include cameras, scanners, or other types of sensors. The sensors may photograph or scan objects within the infrastructure or labels on the objects. For example, the labels may include bar codes, QR codes, tags (e.g., RFID or NFC), or some other type of label. The labels may include cable patching codes or information identifying the type of object and its interfaces. Data structure generation subsystem 110 may determine, based on the retrieved object data, the patch reference code or codes to include within object data structure 250. Computer system 102 may use the cable patching codes stored within the object data structures to facilitate cable installation. Once data structure generation subsystem 110 has generated the data structures, data structure generation subsystem 110 may generate links between rack data structures and object data structures. For example, the links may be based on physical connections between racks and objects, such that the links indicate how racks and objects are connected. Data structure generation subsystem 110 may determine the physical connections based on rack data and object data received from sensors within the infrastructure (e.g., sensors 142, as shown in FIG. 1). For example, the sensors may show or detect physical connections (e.g., between racks, objects, or other devices). Data structure generation subsystem 110 may generate a mapping of rack data structures and object data structures that correspond to the racks and objects that are physically connected.

Figure 3:
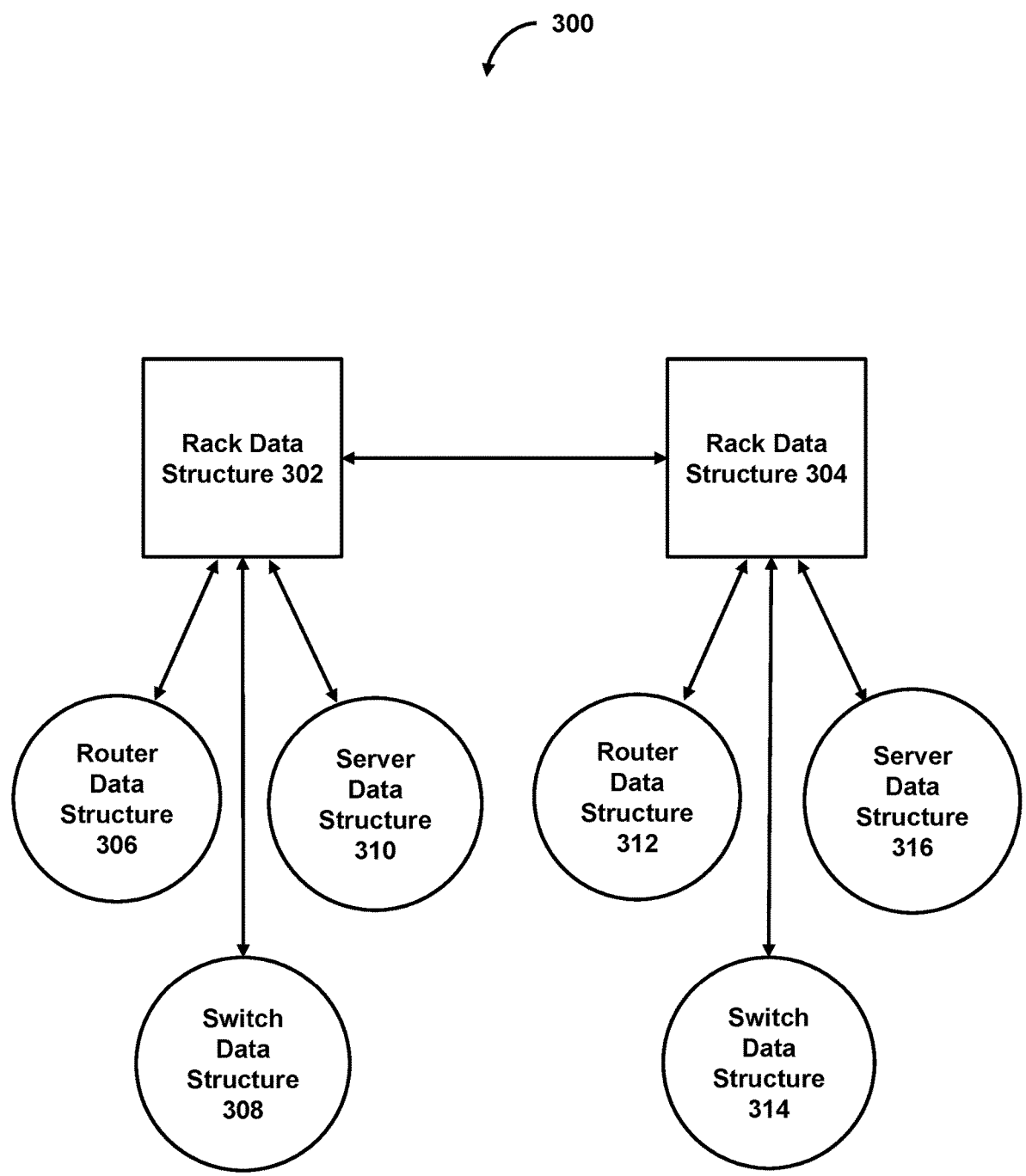
FIG. 3 shows a mapping of rack data structures and object data structures, in accordance with one or more embodiments.

In some embodiments, once data structure generation subsystem 110 has generated the data structures, data structure generation subsystem 110 may generate a mapping showing connections between data structures. For example, FIG. 3 shows a mapping 300 of rack data structures and object data structures, in accordance with one or more embodiments. As shown in FIG. 3, rack data structure 302 and rack data structure 304 are connected. This may indicate that a rack corresponding to rack data structure 302 and a rack corresponding to rack data structure 304 are connected by cabling, are physically touching (e.g., stacked), or are otherwise connected. Rack data structure 302 is further connected with router data structure 306, switch data structure 308, and server data structure 310. Rack data structure 302 may be connected with router data structure 306, switch data structure 308, and server data structure 310 based on a corresponding router, switch, and server residing within the rack corresponding to rack data structure 302. The rack corresponding to rack data structure 302 may be a parent rack for the router corresponding to router data structure 306, the switch corresponding to switch data structure 308, and the server corresponding to server data structure 310. The rack corresponding to rack data structure 302 may be connected with any of the router, the switch, or the server via cable or other physical connection. Rack data structure 304 may be connected with router data structure 312, switch data structure 314, and server data structure 316 via any of the connections or relationships described above or any other connections or relationships.

Data structure generation subsystem 110 may generate links based on the mapping described above. For example, data structure generation subsystem 110 may generate links between rack data structures and object data structures based on the mapping. In some embodiments, the links may be pointers to other data structures. For example, returning to FIG. 2A, links 210, as shown in FIG. 2A, may be links or pointers to other data structures. For example, links 210 may indicate objects that are located within the rack. Links 210 may include a link to object data structure 250. Links 210 may include links to related racks (e.g., racks that are connected, other racks of the same type, etc.). As shown in FIG. 2B, object information 252 may likewise include links (e.g., links 260). Links 260 may include links or pointers to other data structures. For example, links 260 may indicate a rack (e.g., parent rack) within which the object is located (e.g., a link to rack data structure 200). Links 260 may include links to related objects (e.g., objects located within the same rack, objects connected via cables, etc.). Rack data structure 200, as shown in FIG. 2A, and object data structure 250, as shown in FIG. 2B, may correspond to rack data structure 302 and router data structure 306, as shown in FIG. 3. Links 210 of rack data structure 200 and links 260 of object data structure 250 may therefore capture the connection between rack data structure 302 and router data structure 306, as shown in FIG. 3. Data structure generation subsystem 110 may store the generated links in the data structures (e.g., rack data structure 200 and object data structure 250). Data structure generation subsystem 110 may utilize the generated data structures to facilitate cable installation.

Data structure generation subsystem 110 may generate data structures that include links to other data structures. As described above, these links may reflect physical connections between devices within an infrastructure. Data structure generation subsystem 110 may monitor the physical connections over time (e.g., via sensors 142 within the infrastructure, by monitoring planned work or notifications, or using another method). In response to detecting a change to a physical connection, data structure generation subsystem 110 may update the links within the data structures. For example, data structure generation subsystem 110 may receive information (e.g., from sensors 142, as shown in FIG. 1) indicating that an object is no longer connected with a rack. For example, a router corresponding to router data structure 306, as shown in FIG. 3, may be removed from a rack corresponding to rack data structure 302, as shown in FIG. 3. In response, data structure generation subsystem 110 may update links within rack data structure 302 (e.g., links 210, as shown in FIG. 2A), to remove a link or pointer to router data structure 306. Data structure generation subsystem 110 may update links within router data structure 306 (e.g., links 260, as shown in FIG. 2B), to remove a link or pointer to rack data structure 302. Data structure generation subsystem 110 may continuously monitor the physical connections and update the links within the data structures in response to any changes to the physical connections. Data structure generation subsystem 110 may utilize the updated links within the data structures to facilitate cable installation.

Data structure generation subsystem 110 may generate data structures that include links to other data structures based on physical connections between devices corresponding to the data structures. Data structure generation subsystem 110 may update the links in response to detecting any changes to the physical connections between the devices. Data structure generation subsystem 110 may generate utilization metrics for the data structures based on the updated links. For example, utilization metrics may indicate available interfaces and occupied interfaces. For example, available interfaces may indicate unused ports that are available for physical connections. Occupied interfaces may indicate used ports that are not available for physical connections. For example, the utilization metrics may relate to a rack (e.g., how many ports are available or in use across all devices within the rack) or a specific device (e.g., how many of the device's ports are available or in use). Once data structure generation subsystem 110 has generated the utilization metrics, data structure generation subsystem 110 may build the utilization metrics into the data structures. For example, data structure generation subsystem 110 may include utilization metrics describing all devices within a rack for a rack data structure corresponding to the rack. Data structure generation subsystem 110 may include utilization metrics specific to a device for a device data structure corresponding to the device.

For example, FIG. 2A shows rack utilization 212. Rack utilization 212 may include a visual indicator 214. As shown in FIG. 2A, visual indicator 214 may be a progress bar, for example, showing a percent of total ports or interfaces that are occupied. For example, visual indicator 214 may indicate that a small percentage of the total interfaces or ports are occupied. In some embodiments, visual indicator 214 may indicate an amount of the rack that is full. For example, each rack may have one or more capacities (e.g., by volume, by weight, or by some other measurement). Visual indicator 214 may therefore display a portion or percent of the rack's capacity that is full. Rack utilization 212 may further indicate available ports 216 and occupied or in-use ports 218. Available ports 216 and in-use ports 218 may be percentages of a total number of ports, portions of a total number of ports, numbers of available and in-use ports, or some other indicator. The rack utilization 212 further indicates locations for additional physical locations. For example, available ports 216 may indicate the locations of the available ports. The user may interact with available ports 216 (e.g., via user interaction subsystem 122) to cause data structure generation subsystem 110 to display (e.g., via presentation subsystem 120) information about the available ports, such as the locations. Data structure generation subsystem 110 may display the locations of the available ports via rack diagram 220 (as discussed in greater detail below). Data structure generation subsystem 110 may utilize the information of rack utilization 212 to facilitate cable installation.

Once data structure generation subsystem 110 has generated the rack data structures, the object data structures, and the utilization metrics, computer system 102 (e.g., instruction generation subsystem 116) may generate cable installation instructions based on the rack data structures, the object data structures, and the utilization metrics. For example, the cable installation instructions may be based on information included in the utilization metrics that indicates locations for additional physical connections. As discussed above, the utilization metrics may indicate available interfaces or ports and occupied interfaces or ports. Based on this information, instruction generation subsystem 116 may determine which ports or interfaces to designate for additional physical connections. For example, instruction generation subsystem 116 may generate instructions for connecting cables with available ports or interfaces of the objects within the infrastructure. Instruction generation subsystem 116 may take into account other forms of rack utilization. For example, as discussed above, rack utilization may further indicate an amount of a rack that is occupied (e.g., by volume or by weight). Instruction generation subsystem 116 may therefore account for rack utilization (e.g., by volume or by weight), port or interface utilization, and other types of rack and object utilization. Instruction generation subsystem 116 may generate instructions that specify specific cable ends or pairs to be connected with specific ports or interfaces. Instruction generation subsystem 116 may designate specific types or cables to be connected with specific ports or interfaces. Instruction generation subsystem 116 may generate cable installation instructions having any combination of these or other details.

In some embodiments, instruction generation subsystem 116 may output or transmit the cable installation instructions. For example, instruction generation subsystem 116 may transmit the cable installation instructions to an installation system. The installation system may facilitate cable installation by a person (e.g., cable installer). For example, the installation system may display, to the cable installer, the cable installation instructions. The installation machine may display the cable installation instructions to the cable installer via a user device (e.g., a handheld device, a scanner, a computer, a phone, or some other device). The user device may include GPS devices, scanners, cameras, or other sensors for capturing information about the whereabouts or progress of the cable installer. The user device may compare the captured information with the cable installation instructions and may progress through the instructions as the cable installer completes each instruction or may alert the cable installer if there is a discrepancy between the captured information and the cable installation instructions. The cable installation instructions may therefore guide the cable installer through the process of installing the cables within the infrastructure.

In some embodiments, the installation system may be an installation machine. For example, the installation machine may be a robotic device (e.g., a robotic arm or other robotic device). The installation machine may receive cable installation instructions and may execute the instructions. For example, the cable installation instructions may include locations, types of cables, interfaces or ports with which the cables are to be connected, routes along which the cable is to run, or other information. Instruction generation subsystem 116 may transmit the instructions to the cable installation machine and may cause the installation machine to install the cables according to the cable installation instructions.

Figure 4:
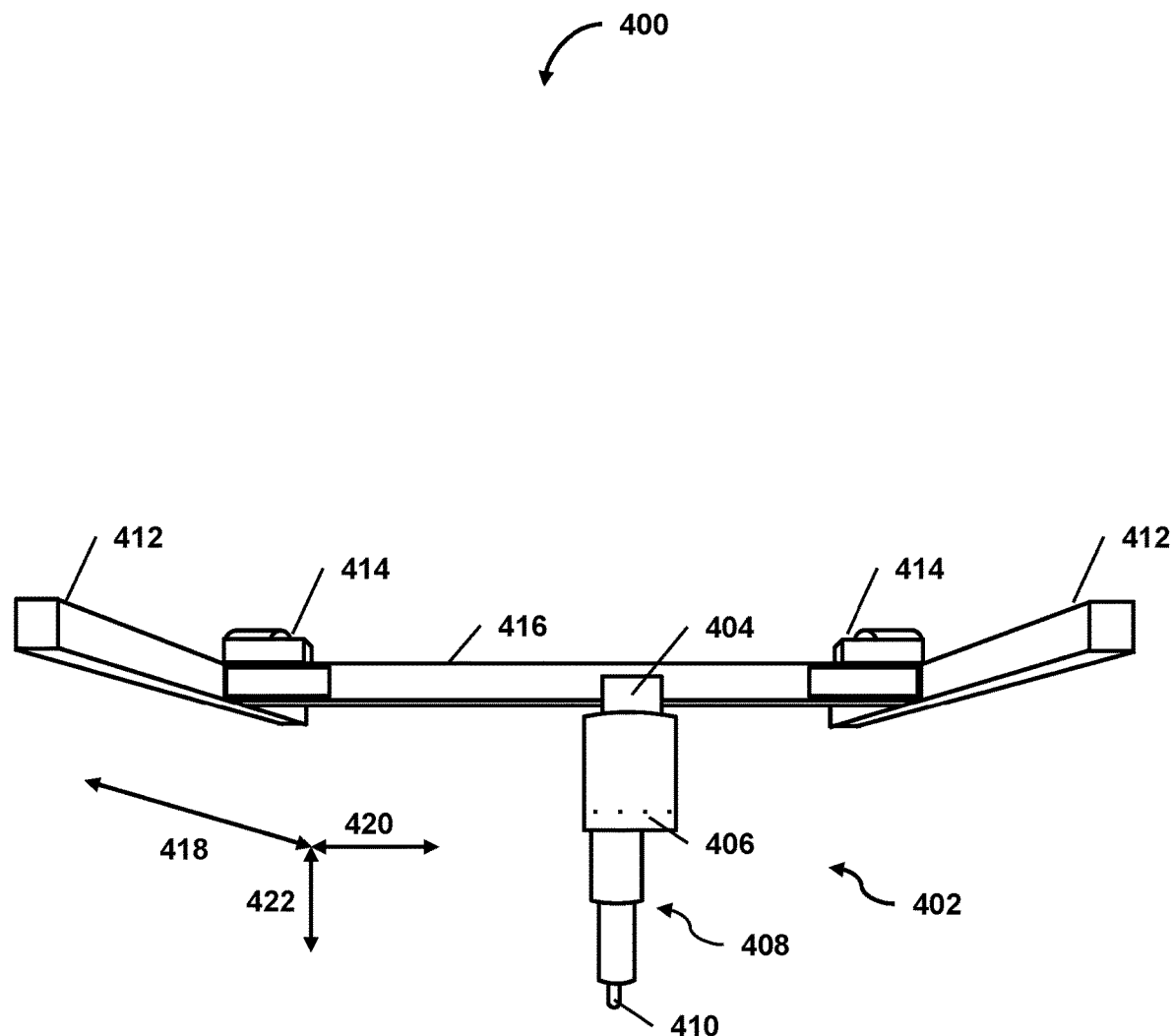
FIG. 4 shows a cable installation machine, in accordance with one or more embodiments.

The cable installation instructions may be sent to a cable installation machine for execution. For example, FIG. 4 shows a cable installation machine 400, in accordance with one or more embodiments. As shown in FIG. 4, cable installation machine 400 may be located within the infrastructure and may, in response to receiving cable installation instructions, install cables within the infrastructure. Cable installation machine 400 may include a rail system that allows the cable installation machine 400 to navigate throughout the cable infrastructure. For example, cable installation machine 400 may include rails 412 that run in a direction 418 (e.g., along a Y axis). Rails 412 allow cable installation machine 400 to move along direction 418. Rails 412 may be parallel with or perpendicular to racks, rails, routes, or other features of the infrastructure.

Cable installation machine 400 may include drive trains 414 that operate in sync to allow for movement in direction 418 along rails 412. Drive trains 414 may have motors or other power sources that allow drive trains 414 to propel cable installation machine along direction 418. Cable installation machine 400 may include a rail 416 that runs in a direction 420 (e.g., along an X axis). Rail 416 may allow cable installation machine 400 to move along direction 420. Rail 416 may be parallel with or perpendicular to racks, rails, routes, or other features of the infrastructure. Cable installation machine 400 may include drive train 404 that allows for movement in direction 420 along rail 416. Drive train 404 may have a motor or another power source that allows drive train 404 to propel cable installation machine along direction 420. Cable installation machine 400 may include a robotic installer 402. For example, robotic installer may include a telescopic arm 408, which may contract or extend to raise and lower an end of the robotic installer 402 along direction 422 (e.g., along a Z axis).

The end of robotic installer 402 may include mechanisms (e.g., grippers) for lifting, moving, and installing cables. The end of robotic installer 402 may have an integrated sensor 410. The integrated sensor 410 may measure cable tension to ensure that cables are not being over-tensioned or damaged. Robotic installer 402 may further include sensors 406, which may measure and provide feedback on distances between the robotic installer 402 and various points (e.g., walls, cable trays, or other points). Sensors 406 may assist robotic installer 402 in navigating within the cable tray system to install the cables. The cable installation machine 400 may include any combination of these and other features and may execute the cable installation instructions as described above or in another manner.

Computer system 102 may utilize the generated data structures to facilitate cable installation in the aforementioned ways or in other ways. For example, the system may use the data included in the data structures to determine optimal routes between racks within the infrastructure. In some embodiments, the system may use the data included in the data structures to determine optimal patching of racks within the infrastructure. The improved efficiency and accuracy of the data structure generation methods described herein may, in turn, improve routing and patching capabilities of the system.

Intelligent Cable Routing Between Racks

In some embodiments, system 100 may facilitate cable routing between racks. In some embodiments, system 100 may facilitate cable installation.

Computer system 102 (e.g., routing subsystem 112) may receive a selection of a first rack and a second rack or second racks within an infrastructure. Routing subsystem 112 may generate a primary cable route between the first rack and the second rack or second racks. The primary cable route may be an optimal route between the first rack and a second rack. Routing subsystem 112 may retrieve diversity requirements of the infrastructure, which may include, for example, a required number of secondary cable routes between the first rack and the second rack or second racks and required attributes of the secondary cable routes. Routing subsystem 112 may generate the secondary cable routes between the first and second rack or second racks based on the diversity requirements. Routing subsystem 112 may additionally retrieve cable patching rules for patching the first and second racks and may determine a first patching scheme for patching the first rack and a second patching scheme for patching each second rack. Routing subsystem 112 may transmit, to a vendor, instructions for generating cable segments for the routes and the patching schemes. For example, the instructions may include lengths of the routes and the patching schemes and types of cables for the routes and the patching schemes. Routing subsystem 112 may receive, from the vendor, the generated cables and may cause the generated cables to be installed.

Routing subsystem 112 may receive a selection of a first rack and a second rack within an infrastructure. Routing subsystem 112 may receive the selection from a user (e.g., via user interaction subsystem 122). For example, the user may select the first rack and the second rack from a first set of racks and a second set of racks. Routing subsystem 112 may determine the first set of racks and the second set of racks based on the first set of racks and the second set of racks meeting certain rack requirements. For example, routing subsystem 112 may retrieve first rack requirements for a first end of master cables and second rack requirements for a second end of master cables. In some embodiments, the master cables may be cables that are used to connect the first rack with the second rack (e.g., as opposed to patching cables). The first and second rack requirements may depend on the type of the master cables (e.g., fiberoptic cables, network cables, power cables, or other suitable cable types). For example, the master cables may have certain connectors and may require certain interfaces or ports at the ends of the master cables in order to connect with the first rack and the second rack. In other words, first and second sets of racks may be determined based on interface information.

The interface information may be retrieved from rack data structures or object data structures associated with the first or second rack. The rack requirements may stipulate the types of rack that the master cables may connect with. For example, the rack requirements may stipulate that the first rack be a first type of rack (e.g., a server rack) and that the second rack be a second type of rack (e.g., patch rack). In other words, first and second sets of racks may be determined based on classification information. The classification information may be retrieved from rack data structures or object data structures associated with the first or second rack. The rack requirements may stipulate one or more objects that must exist within the first rack and the second rack. For example, the rack requirements may stipulate that the first rack must include a server and that the second rack must include a router. The rack requirements may stipulate location requirements of the first and second racks. For example, the first rack may be required to be at a first height and the second rack may be required to be at a second height. In some embodiments, other rack requirements may exist.

Figure 5A:
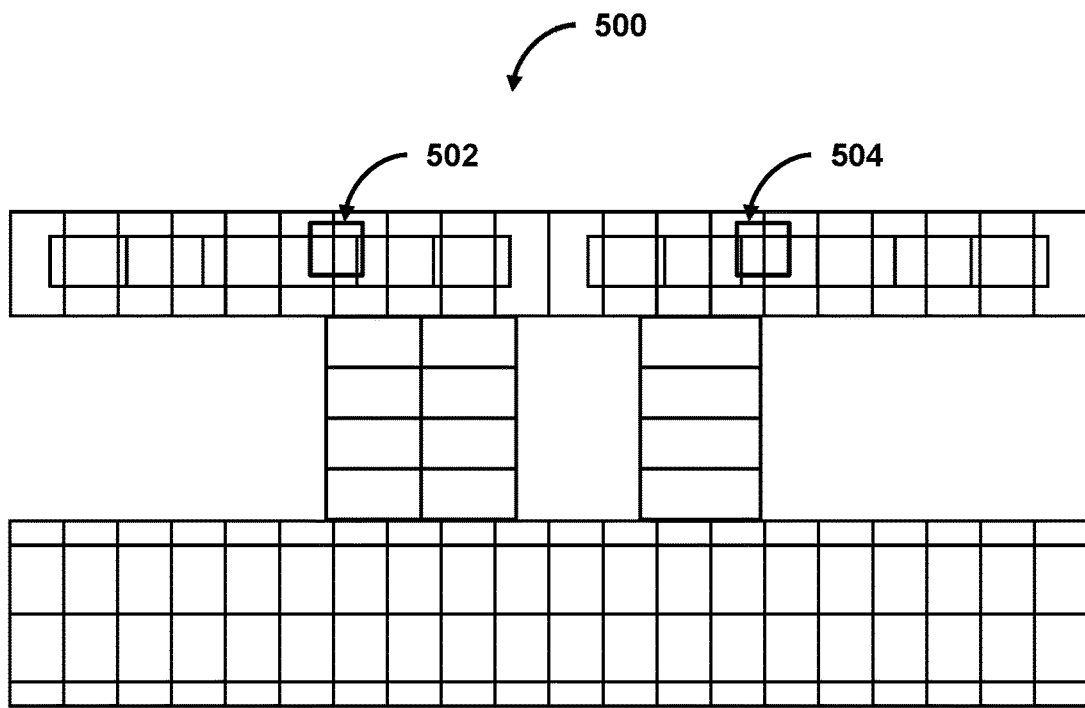
FIGS. 5A and 5B show examples of first racks that meet first rack requirements and second racks that meet second rack requirements, in accordance with one or more embodiments.
Figure 5B:
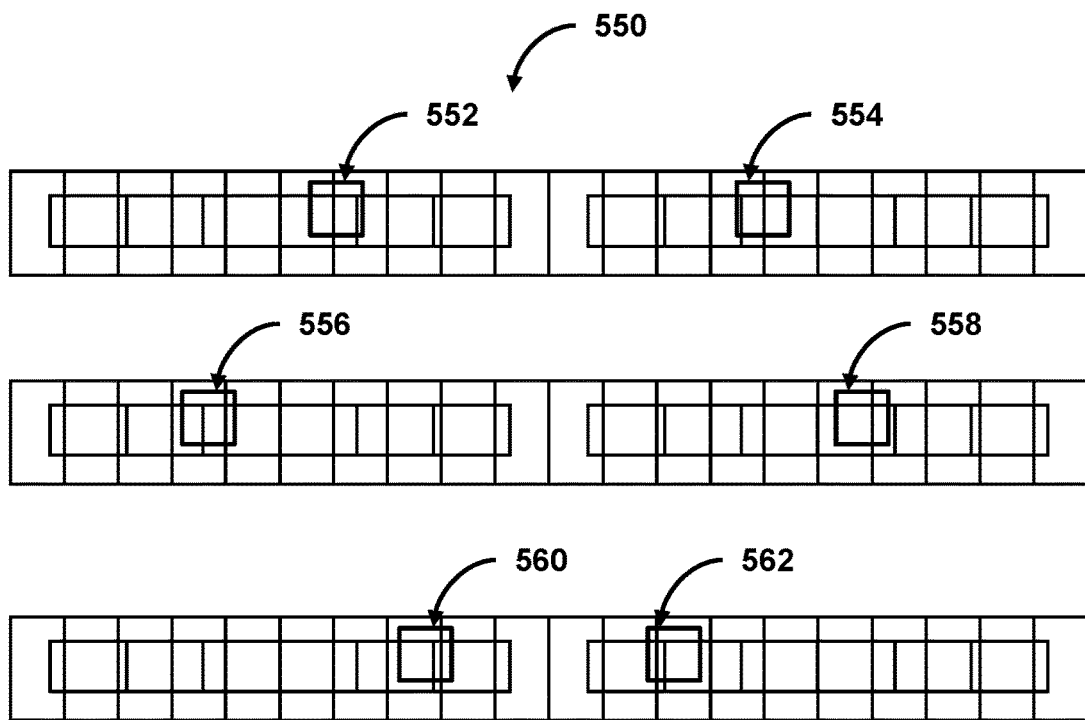

Routing subsystem 112 may determine a first set of racks that meet first rack requirements and a second set of racks that meet second rack requirements. For example, FIGS. 5A and 5B show first racks 500 that meet first rack requirements and second racks 550 that meet second rack requirements, in accordance with one or more embodiments. For example, FIG. 5A shows an example of first racks 500 (e.g., A-side racks) that meet first rack requirements. In some embodiments, a display of first racks 500 may be generated via presentation subsystem 120. In other words, the display may show the first set of racks discussed above. In some embodiments, a user may select (e.g., via user interaction subsystem 122) a first rack or multiple first racks from the first set of racks. For example, the user may select rack 502, rack 504, or both racks. The selection of the first rack or the first racks may be received by routing subsystem 112. The first rack or first racks may be used as starting points for the primary cable route or routes.

FIG. 5B shows an example of second racks 550 (e.g., B-side racks) that meet second rack requirements. In some embodiments, a display of second racks 550 may be generated via presentation subsystem 120. In other words, the display may show the second racks discussed above. In some embodiments, a user may select (e.g., via user interaction subsystem 122) a second rack or multiple second racks from the second set of racks. For example, the user may select rack 552, rack 554, rack 556, rack 558, rack 560, rack 562, or any combination of those racks. The selection of the second rack or the second racks may be received by routing subsystem 112. In some embodiments, routing subsystem 112 may select the second rack or second racks that meet the second rack requirements without informing the user of the locations of the second rack or second racks (e.g., without displaying the locations to the user). The second rack or second racks may be used as endpoints for the primary cable route or routes. Routing subsystem 112 may determine primary routes and secondary routes between the first rack or racks and the second rack or racks.

Routing subsystem 112 may receive the selection of the first rack and the second rack, as described above. Routing subsystem 112 may generate a primary cable route between the first rack and the second rack for a primary master cable. For example, the primary cable route may be an optimal route between the first rack and the second rack. Routing subsystem 112 may determine the optimal route out of all possible routes between the first rack and the second rack. Routing subsystem 112 may determine the optimal route based on distance, density, maximum capabilities, diversity requirements for cabling, other factors, or any combination of factors. For example, routing subsystem 112 may compare multiple routes (e.g., route A and route B). Routing subsystem 112 may determine that route A is the optimal route because route A is shorter and more direct than route B. In some embodiments, routing subsystem 112 may perform such a comparison for every possible route within the infrastructure that connects the first rack and the second rack. Routing subsystem 112 may select the optimal route based on this comparison. Routing subsystem 112 may determine the most compliant route with respect to standards, regulations, safety precautions, internal guidelines, or other guidelines. For example, routing subsystem 112 may compare route A with route B and determine that route A is more compliant than route B based on route A following all general safety guidelines as well as best practice guidelines that are specific to the infrastructure, whereas route B follows only the general safety guidelines. In some embodiments, routing subsystem 112 may perform such a comparison for every possible route within the infrastructure that connects the first rack and the second rack. Routing subsystem 112 may select the most compliant route based on this comparison. Routing subsystem 112 may determine the most cost-efficient route (i.e., using the least materials or requiring the least manpower for installation). For example, routing subsystem 112 may compare route A with route B and determine that route A is more cost-efficient than route B based on route A following a more direct path than path B and avoiding hard-to-reach areas of the infrastructure. In some embodiments, routing subsystem 112 may perform such a comparison for every possible route within the infrastructure that connects the first rack and the second rack. Routing subsystem 112 may select the most cost-efficient route based on this comparison. Routing subsystem 112 may determine the primary route between the first rack and the second rack according to any of the aforementioned factors or a combination of factors.

Routing subsystem 112 may receive the selection of the first rack and multiple second racks. Routing subsystem 112 may generate a primary cable route or routes between the first rack and the second racks for primary master cables. For example, the primary cable route may be an optimal route between the first rack and one of the second racks. In another example, the primary cable routes may be optimal routes between the first rack and each of the second racks. In some embodiments, for each second rack, routing subsystem 112 may determine the optimal route out of all possible routes between the first rack and the second rack. Routing subsystem 112 may determine each optimal route based on distance, density, maximum capabilities, diversity requirements for cabling, other factors, or any combination of factors. Routing subsystem 112 may determine the most compliant route to each second rack with respect to standards, regulations, safety precautions, internal guidelines, or other guidelines. Routing subsystem 112 may determine the most cost-efficient route to each second route (i.e., using the least materials or requiring the least manpower for installation). Routing subsystem 112 may determine the primary routes between the first rack and the second racks according to any of the aforementioned factors or a combination of factors. Routing subsystem 112 may determine each optimal route between the first rack and a second rack based on the context of the other primary routes. For example, routing subsystem 112 may determine the combination of optimal routes having the lowest number of nodes in common with each other (e.g., to avoid intersecting cables). Routing subsystem 112 may select a single route (e.g., between the first rack and one of the second racks) as the primary route. The remaining optimal routes may function as secondary routes (e.g., as described below). Routing subsystem 112 may cause the primary cables to be installed along the primary routes between the first rack and the second racks.

In some embodiments, a primary cable route may be a first length (e.g., a primary cable route length). The primary cable route length may include additional length of cable necessary to go from the rack to an overhead tray tier, to a location of a respective patch rack, or to transition between different tiers. In some embodiments, multiple primary cable routes may be a first set of lengths (e.g., primary cable route lengths). For example, any primary routes between the first rack and a second rack may have an individual length. Additionally, routing subsystem 112 may determine a cable type or types for the primary master cable or cables. Routing subsystem 112 may retrieve cable type information from a cable type database (e.g., database 132, as shown in FIG. 1), a cable type catalog, or another source. For example, the cable type may be based on a length of the primary route, a location of the primary route, a type of interface at the first rack or the second rack, a number of interfaces with which the primary master cable will connect, another factor, or a combination of factors. Routing subsystem 112 may determine multiple required attributes for each primary master cable and, if such a cable does not exist, computer system 102 (e.g., instruction generation subsystem 116) may instruct a vendor to manufacture the required cable (e.g., as will be discussed in greater detail below). In some embodiments, once routing subsystem 112 has received the primary master cables of the required length and type, routing subsystem 112 may cause the primary master cables to be installed along the primary routes.

In some embodiments, once routing subsystem 112 has received the selection of the first rack and the second rack or second racks, routing subsystem 112 may determine a primary route and secondary routes between the first rack and each second rack. For example, routing subsystem 112 may retrieve diversity requirements of the infrastructure. Diversity requirements may be alternative routes connecting the first rack with the second rack or second racks such that potential damage to any one cable, still provides alternate pathways to the second rack or racks. For example, diversity requirements may stipulate a certain number of secondary routes that are required for each primary route. In some embodiments, diversity requirements may stipulate attributes of the secondary routes. For example, the diversity requirements may require that the secondary routes do not overlap with each other or with the primary route or that the secondary routes have less than a certain number of nodes in common with each other. The diversity requirements may include any other required attributes of the secondary routes or a combination of required attributes. The diversity requirements may be specific to the infrastructure, the client, the area, some other factor, or a combination of factors. In some embodiments, based on the diversity requirements, routing subsystem 112 may determine secondary routes between the first rack and the second rack or second racks that meet the diversity requirements. Routing subsystem 112 may select a combination of secondary paths that is the most optimal and that meets all diversity requirements.

The secondary cable routes may have secondary cable route lengths. The secondary cable route lengths may include additional length of cable necessary to go from the rack to an overhead tray tier, to a location of a respective patch rack, or to transition between different tiers. The secondary cable routes may be a second set of lengths. For example, any secondary routes between the first rack and a second rack may have a specific length. Additionally, routing subsystem 112 may determine cable types for the secondary master cables. Routing subsystem 112 may retrieve cable type information from a cable type database (e.g., database 132, as shown in FIG. 1), a cable type catalog, or another source. For example, the cable types may be based on lengths of the secondary routes, locations of the secondary routes, types of interfaces at the first rack or the second rack, a number of interfaces with which each secondary master cable will connect, another factor, or a combination of factors. Routing subsystem 112 may determine multiple required attributes for each secondary master cable and, if such a cable does not exist, computer system 102 (e.g., instruction generation subsystem 116) may instruct a vendor to manufacture the required cable (e.g., as will be discussed in greater detail below). In some embodiments, once routing subsystem 112 has received the secondary master cables of the required length and type, routing subsystem 112 may cause the secondary master cables to be installed along the secondary routes.

Figure 6:
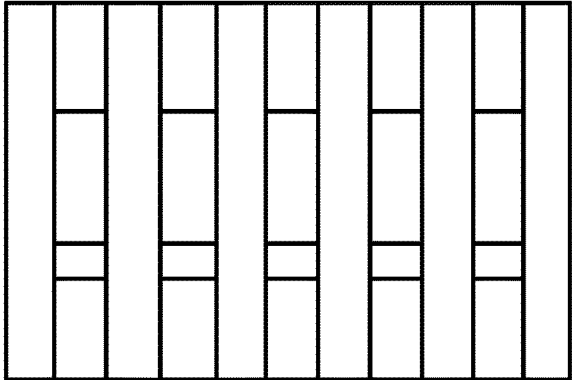
FIG. 6 shows routing details for routes between first racks and second racks, in accordance with one or more embodiments.

In some embodiments, after determining the primary routes and the secondary routes, routing subsystem 112 may display the primary route and the secondary routes to a user. For example, FIG. 6 shows routing details 600 for routes between first racks and second racks, in accordance with one or more embodiments. For example, computer system 102 (e.g., presentation subsystem 120) may display routing details 600 to the user. Routing details 600 may include a route diagram 604 and design details 606. In some embodiments, design details 606 may include locations 608 and routes 610 of each route (e.g., the primary routes and secondary routes that were previously determined). In some embodiments, locations 608 may include locations 612-624. Locations 608 may be second racks that met second rack requirements (e.g., as previously determined). For example, locations 608 may correspond to racks 552-562, as shown in FIG. 5B. In some embodiments, each location 612-624 may be displayed with a corresponding route of routes 610. In some embodiments, routes 610 may include paths 626-638 and distances 640-652. Each path 626-638 may be a path between the first rack and a second rack. For example, path 626 may connect the first rack with location 612 (e.g., a second rack). The length of path 626 may be distance 640. In some embodiments, design details 606 may further include cable types for each of the routes 610, or the cable type may be the same for all of the routes 610. Routing subsystem 112 may utilize the routing details 600 to retrieve and install the correct master cables.

In some embodiments, route diagram 604 may display a graphic display of the routes 610. For example, route diagram 604 may be an outline of racks and cable trays within an infrastructure. In some embodiments, routes 610 may be indicated within route diagram 604. For example, routes 610 may be shown in different colors, line types, or highlighting or may be otherwise indicated. In some embodiments, routes 610 may be shown on route diagram 604 in response to a user interaction with one or routes 610 (e.g., via user interaction subsystem 122). For example, in response to the user interacting with one of the routes 610 (e.g., hovering over a route with a mouse, clicking on a route with a mouse, selecting a route via voice command, or otherwise interacting with a route), routing subsystem 112 may cause the corresponding portion of route diagram 604 to appear, become highlighted, change color, become bolded, or otherwise become emphasized. The user may interact with the display of routing details 600 to alter or update the design details 606. For example, the user may select or draw (e.g., via route diagram 604) an alternate route for one or more locations 608 (e.g., second racks). Routing subsystem 112 may utilize the route diagram to confirm the routing details 600 with the user and receive modifications from the user before retrieving and installing the cables.

Routing subsystem 112 may determine primary and secondary routes for connecting a first rack and a second rack via cables. In some embodiments, computer system 102 (e.g., patching subsystem 114) may determine patching schemes for the first and second racks. Patching schemes may be connections or suggested connections between a cable (e.g., strands of a multi-strand cable) and interfaces of devices within a rack. For example, patching subsystem 114 may retrieve cable patching rules (e.g., from database 132). In some embodiments, patching subsystem 114 may retrieve cable patching rules that have been predetermined based on the devices within the infrastructure. For example, the cable patching rules may depend on rack types of the first rack and the second rack. The cable patching rules may depend on cable patching codes associated with objects being patched into the first rack and the second rack. The cable patching rules may depend on other factors or a combination of factors. The cable patching rules may include one or more logic configurations. For example, logic configurations may stipulate that cables are to be added based on certain conditions. As an example, cables may be added always or based on a certain service type. In some embodiments, cables may be added when a leaf switch has a certain leaf number, when a spine switch has a certain spine number, when a spine-leaf architecture (e.g., described in detail below) has a certain spine size, or under another condition. As an example, a patching rule may stipulate that a patching cable is to be added when a service type matches a certain value (e.g., a customer-defined value). The logic configurations may be preconfigured or input by a user.

Figure 7A:
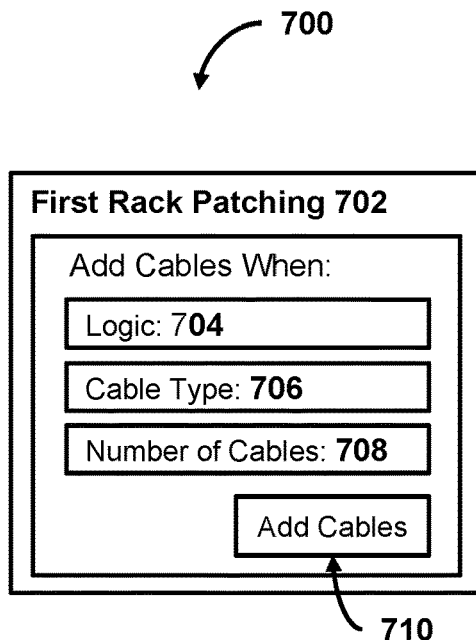
FIGS. 7A and 7B show a first logic configuration for patching a first rack and a second logic configuration for patching a second rack, in accordance with one or more embodiments.
Figure 7B:
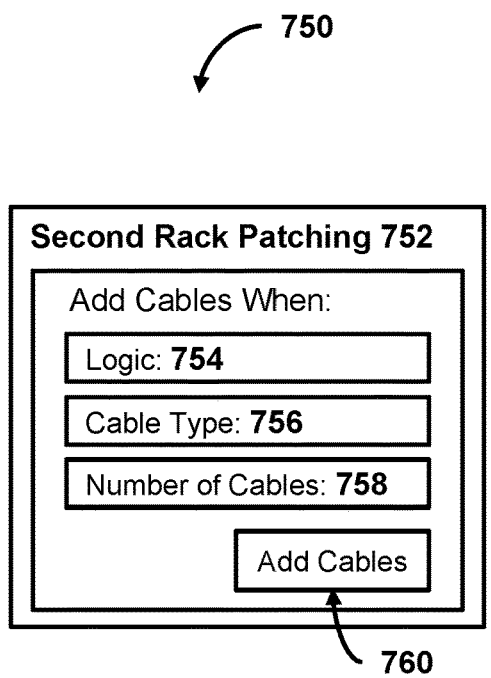

In some embodiments, patching subsystem 114 may receive the cable patching rules as input from a user. For example, FIGS. 7A and 7B show a first logic configuration 700 for patching a first rack and a second logic configuration 750 for patching a second rack, in accordance with one or more embodiments. As shown in FIG. 7A, a display of first logic configuration 700 may be presented to a user (e.g., via presentation subsystem 120) and the user may interaction with the display (e.g., via user interaction subsystem 122). The user may configure the logic for the first rack patching 702. For example, the user may select (e.g., from a drop-down menu) or input one or more values for logic 704.

In some embodiments, logic 704 may allow the user to specify conditions such as always, service type, leaf number, spine size, spine number, or other conditions. The user may specify a cable type 706 that is to be added under the selected condition (e.g., logic 704). For example, the user may select (e.g., from a dropdown menu) or input various specifications for the cable type 706, such as material, size, brand, or other properties. Routing subsystem 112 may retrieve cable type information from a cable type database (e.g., database 132, as shown in FIG. 1), a cable type catalog, or another source and display the cable types as options to the user. The user may specify a number of cables 708 of the cable type 706 that are to be added under the conditions of logic 704. For example, the user may select or input a desired value for the number of cables 708. The user may input the details of first rack patching 702 by selecting or clicking on button 710. In some embodiments, patching subsystem 114 may store the first cable patching rules input by the user for later use in generating a first patching scheme.

As shown in FIG. 7B, a display of second logic configuration 750 may be presented to a user (e.g., via presentation subsystem 120) and the user may interaction with the display (e.g., via user interaction subsystem 122). The user may configure the logic for the second rack patching 752. For example, the user may select (e.g., from a dropdown menu) or input one or more values for logic 754. In some embodiments, logic 754 may allow the user to specify conditions such as always, service type, leaf number, spine size, spine number, or other conditions. The user may specify a cable type 756 that is to be added under the selected condition (e.g., logic 754). For example, the user may select (e.g., from a dropdown menu) or input various specifications for the cable type 756, such as material, size, brand, or other properties. The user may specify a number of cables 758 of the cable type 756 that are to be added under the conditions of logic 754. For example, the user may select or input a desired value for the number of cables 758. The user may input the details of second rack patching 752 by selecting or clicking on button 760. In some embodiments, patching subsystem 114 may store the second cable patching rules input by the user for later use in generating a second patching scheme.

In some embodiments, once patching subsystem 114 has retrieved and stored the cable patching rules, patching subsystem 114 may determine a first patching scheme for patching the first rack and a second patching scheme for patching the second rack. For example, to determine the patching schemes, patching subsystem 114 may analyze the cable patching rules (e.g., which may be input by a user, as shown in FIGS. 7A and 7B). In some embodiments, patching subsystem 114 may analyze the cable patching rules against cable patching codes corresponding to the first and second racks. For example, patching subsystem 114 may retrieve, from data structures associated with the first and second racks or objects within the first and second racks, cable patching codes corresponding to the first and second racks or objects within the first and second racks.

The cable patching codes may assist patching subsystem 114 in determining the objects that require patching and what ports or interfaces are required for the patching. In some embodiments, patching subsystem 114 may compare the cable patching codes with the cable patching rules to determine whether conditions of the cable patching rules are satisfied. For example, a rule may stipulate that a patching cable should be added when a certain condition is satisfied (e.g., always or based on service type, leaf number, spine size, spine number, etc.). Patching subsystem 114 may analyze the cable patching codes retrieved from the data structures and may determine whether the condition of the patching rule is satisfied. In some embodiments, if the condition is satisfied, patching subsystem 114 may add one or more cables to the cable patching scheme (e.g., according to the patching details input by the user, as shown in FIGS. 7A and 7B). In some embodiments, patching subsystem 114 may determine a first patching scheme for the first rack and a second patching scheme for the second rack (or second patching schemes for the second racks) using the methods described above. In some embodiments, methods of determining patching schemes are discussed in greater detail below.

Figure 8:
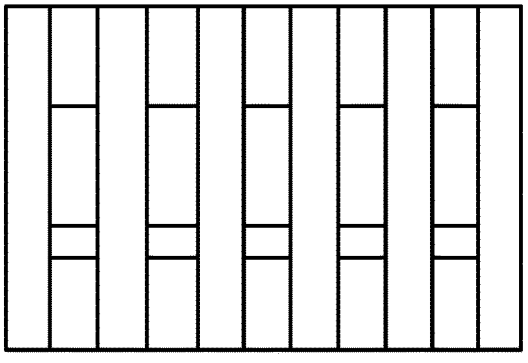
FIG. 8 shows routes and patching details for routing and patching new cables, in accordance with one or more embodiments.

Routing subsystem 112 may generate primary and secondary routes between first and second racks, and patching subsystem 114 may determine first and second patching schemes for patching the first and second racks. In some embodiments, once the primary and secondary routes and the first and second patching schemes have been determined, computer system 102 (e.g., instruction generation subsystem 116) may transmit instructions for retrieving cables for the primary and secondary routes and the first and second patching schemes. For example, the instructions may include a cable type, a cable length, and a quantity of the primary master cable, the secondary master cables, and patching cables for the first and second patching schemes. For example, FIG. 8 shows routing and patching details 802 for routing and patching new cables, in accordance with one or more embodiments. In some embodiments, display 800 may be presented to a user (e.g., via presentation subsystem 120).

In some embodiments, display 800 may include routing and patching details 802 (e.g., associated with the primary and secondary routes and the first and second patching schemes). Routing and patching details 802 may include a routing and patching diagram 804. Routing and patching diagram 804 may display a graphic display of the primary and secondary routes and the first and second patching schemes. For example, routing and patching diagram 804 may be an outline of racks and cable trays within an infrastructure. The primary and secondary routes and the first and second patching schemes may be indicated within routing and patching diagram 804. For example, the primary and secondary routes and the first and second patching schemes may be shown in various colors, line types, or highlighting or may be otherwise indicated. The primary and secondary routes and the first and second patching schemes may be shown on routing and patching diagram 804 in response to a user interaction with one of the primary and secondary routes and the first and second patching schemes (e.g., via user interaction subsystem 122). For example, in response to the user interacting with one of cables 806 (e.g., hovering over a route with a mouse, clicking on a route with a mouse, selecting a route via voice command, or otherwise interacting with a route), routing subsystem 112 may cause the corresponding portion of routing and patching diagram 804 to appear, become highlighted, change color, become bolded, or otherwise become emphasized.

Display 800 may include information about cables 806. In some embodiments, cables 806 may include the primary master cable, the secondary master cables, and patching cables for the first and second patching schemes. For each of the cables 806, routing and patching details 802 may additionally include a cable type 818 (e.g., type 808, type 810, or type 812), quantity 820, diversity 822, notes 824, or other information. In some embodiments, diversity 822 may be a true or false value indicating whether each cable of cables 806 includes diverse routes (e.g., secondary routes) as discussed above. In some embodiments, display 800 may include additional information about cables 806.

In some embodiments, display 800 may include information about a cable supply 814 for cables 806. For example, display 800 may allow the user to interact with field 816 (e.g., via user interaction subsystem 122) to select a vendor or other source from which to retrieve cables 806. In some embodiments, field 816 may be a dropdown menu from which the user may select a vendor or an empty field into which the user may input the desired vendor. The user's selection or input for field 816 may cause instruction generation subsystem 116 to transmit instructions (e.g., to the vendor input of field 816) for retrieval of cables 806 from the vendor. The instructions for retrieval may include an order placed with the vendor, an instruction to transport the cables to a facility, an instruction to transport the cables to an installation location, or other instructions. Instruction generation subsystem 116 may further generate instructions for cable installation.

In some embodiments, once the primary and secondary routes and the first and second patching schemes have been determined, instruction generation subsystem 116 may transmit instructions for generating cables for the primary and secondary routes and the first and second patching schemes. For example, instruction generation subsystem 116 may transmit an instruction to a vendor (e.g., as designated by the user in field 816) to generate the primary cable route length and type for the primary master cable, the secondary cable route lengths and types for the secondary master cables, the first patching length and type for the first cable type, and the second patching length and type for the second cable cables. Instruction generation subsystem 116 may transmit instructions for generation of cables to a different vendor (e.g., a manufacturer) than a vendor to which instruction generation subsystem 116 transmits cable retrieval instructions. In some embodiments, a single vendor may handle both retrieval and manufacture requests.

Instruction generation subsystem 116 may transmit, to a vendor, an instruction to retrieve the cables and, if the cables are not available, may transmit an instruction to generate the cables. In some embodiments, if the cables are merely out of stock, instruction generation subsystem 116 may instruct the vendor to manufacture the required cables. In some embodiments, if the cables require custom manufacturing, instruction generation subsystem 116 may instruct the vendor to manufacture the custom cables according to the requirements of the system. The instructions may include exact specifications for the cables, such as coatings, colors, materials, or other details. For example, instruction generation subsystem 116 may automatically generate a respective part number for the custom cable design based on a manufacturer, a length of cable, a location of the infrastructure, and any additional information for the custom cable design. The instructions for generation may include an order placed with the vendor, an instruction to transport the cables to a facility, an instruction to transport the cables to an installation location, or other instructions. Instruction generation subsystem 116 may further generate instructions for cable installation.

Routing subsystem 112 may determine primary and secondary routes for master cables between a first rack and a second rack, and patching subsystem 114 may determine patching schemes for patching the first rack and the second rack. Instruction generation subsystem 116 may transmit an instruction to retrieve (or generate) cables for the primary and secondary routes and for the first and second patching schemes. In some embodiments, once the cables have been received, instruction generation subsystem 116 may generate instructions for installing the cables according to the primary and secondary cable routes and according to the first and second patching schemes. For example, the instructions may include the primary route along with the primary cable type and length (along with any cable identifiers) for the primary master cable that is to be installed along the primary route. The instructions may include the secondary routes along with the secondary cable types and lengths (along with any cable identifiers) for the secondary master cables that are to be installed along the secondary routes. The instructions may further include the cable types and lengths for the patching cables that are to be installed for the first and second patching schemes. The instructions may further include directions, visualizations, or other guides for assisting the installation process.

Instruction generation subsystem 116 may output or transmit the cable installation instructions. For example, instruction generation subsystem 116 may transmit the cable installation instructions to an installation system. The installation system may facilitate cable installation by a person (e.g., cable installer). For example, the installation system may display, to the cable installer, the cable installation instructions. The installation machine may display the cable installation instructions to the cable installer via a user device (e.g., a handheld device, a scanner, a computer, a phone, or some other device). The user device may include GPS devices, scanners, cameras, or other sensors for capturing information about the whereabouts or progress of the cable installer. The user device may compare the captured information with the cable installation instructions and may progress through the instructions as the cable installer completes each instruction or may alert the cable installer if there is a discrepancy between the captured information and the cable installation instructions. The cable installation instructions may therefore guide the cable installer through the process of installing the cables within the infrastructure.

The installation system may include an installation machine. For example, the installation machine may be a robotic device (e.g., a robotic arm or other robotic device). The installation machine may receive cable installation instructions and may execute the instructions. For example, the cable installation instructions may include locations, types of cables, interfaces or ports with which the cables are to be connected, routes along which the cable is to run, or other information. Instruction generation subsystem 116 may transmit the instructions to the cable installation machine and may cause the installation machine to install the cables according to the cable installation instructions, such as cable installation machine 400, as shown in FIG. 4. As shown in FIG. 4, cable installation machine 400 may be located within the infrastructure and may, in response to receiving cable installation instructions, install cables within the infrastructure.

Routing subsystem 112 or patching subsystem 114 may receive from a user device installation data indicating cables that have been installed for the primary cable route, the secondary cable routes, the first patching scheme, or the second patching scheme. Routing subsystem 112 or patching subsystem 114 may store an installation progress based on the received installation data. The installation progress may be presented to the user (e.g., via presentation subsystem 120). For example, presentation subsystem 120 may generate for display the first rack and the second rack with an indication of the installation progress. The indication of the installation progress may be a progress bar for each route, a progress bar for the overall installation, a changing color of the first rack and the second rack (e.g., red to yellow to green as installation progresses), a highlighting of certain routes that have been installed, or another indication. The user or the system may modify (e.g., via user interaction subsystem 122) the instructions based on the cable installation progress. For example, in response to an installation progress indicating that a particular route is not being installed properly or quickly enough, the user or the system may cause instruction generation subsystem 116 to send additional guidelines, instructions, tips, or other information to the cable installer.

Computer system 102 may utilize the rules and routes generated by routing subsystem 112 and patching subsystem 114 in the aforementioned ways or in other ways. For example, computer system 102 may utilize the cable patching rules generated or received by patching subsystem 114 and the patching codes retrieved from data structures to intelligently determine optimal patching schemes for each rack. In some embodiments, computer system 102 may learn, from patching schemes that were previously determined, to predict patching schemes for new racks. The improvements described herein for routing and patching may, in turn, improve the system's ability to learn and predict patching schemes intelligently.

Intelligent Cable Patching of Racks

In some embodiments, system 100 may facilitate cable patching. In some embodiments, system 100 may facilitate cable installation.

Computer system 102 (e.g., patching subsystem 114) may retrieve information about a rack and devices that are to be patched into the rack. For example, the retrieved information may include cable patching rules and cable patching codes. The cable patching rules may stipulate conditions for adding patching cables, and the cable patching codes may assist patching subsystem 114 in determining whether those conditions have been satisfied. In some embodiments, based on the retrieved information, patching subsystem 114 may generate a suggested/recommended patching scheme and may transmit the suggested/recommended patching scheme to a user device or to a patching machine.

In some embodiments, patching subsystem 114 may retrieve information about a rack and devices that are to be patched into the rack. For example, the retrieved information may include cable patching rules. In some embodiments, patching subsystem 114 may retrieve cable patching rules that have been predetermined based on the devices within the infrastructure. For example, the cable patching rules may depend on rack types of the first rack and the second rack. The cable patching rules may depend on cable patching codes associated with objects being patched into the first rack and the second rack. The cable patching rules may depend on other factors or a combination of factors. The cable patching rules may include one or more logic configurations. For example, logic configurations may stipulate that cables may be added based on certain conditions (e.g., always, service type, leaf number, spine size, spine number, etc.). The logic configurations may be preconfigured or input by a user. In some embodiments, patching subsystem 114 may utilize the cable patching rules to determine cable patching schemes for racks within the infrastructure.

In some embodiments, patching subsystem 114 may retrieve information about a rack and devices that are to be patched into the rack. For example, the retrieved information may include cable patching codes. For example, cable patching codes may assist patching subsystem 114 in understanding what type of object is in the rack. For example, cable patching codes may designate an object as a router, a network switch, or another object. In some embodiments, cable patching codes may designate interfaces on an object (e.g., an interface on a router, an interface on a network switch, or another interface) or interfaces or ports that are required for patching the object into a rack. In some embodiments, patching subsystem 114 may retrieve the cable patching codes from data structures associated with the rack. In some embodiments, patching subsystem 114 may utilize the cable patching codes to determine cable patching schemes for racks within the infrastructure.

In some embodiments, once patching subsystem 114 retrieves the cable patching rules and the cable patching codes, patching subsystem 114 may compare the cable patching codes with cable patching rules (e.g., as described above) in order to determine whether conditions of the cable patching rules are satisfied. For example, if the cable patching rules specify that a certain patching cable is to be added when a rack contains a server in a certain position within the rack, patching subsystem 114 may analyze the cable patching codes to determine what object is in the certain position. If the server is in the required position, patching subsystem 114 may determine a patching scheme in accordance with the cable patching rule. For example, the cable patching rule may require that a certain number of a particular cable be used to patch the rack based on the server being in the required position. Patching subsystem 114 may thereby determine the patching scheme based on the cable patching rules and the cable patching scheme.

In some embodiments, patching subsystem 114 may retrieve information about an infrastructure within which patching subsystem 114 is determining patching schemes. For example, the infrastructure may require a certain architecture of cabling. The infrastructure may require traditional architecture or alternative architecture, such as spine-leaf architecture. For example, spine-leaf architecture may be a data center network topology that consists of two switching layers: a spine and leaf. A spine may be a top-tier switch and a leaf may be a lower-tier switch. The leaf layer may include access switches that aggregate traffic from servers and connect directly into the spine or network core. Spine switches may interconnect all of the leaf switches in a full-mesh topology. In order to create the mesh topology of the spine-leaf architecture, certain connections may be required to be cabled or patched in a specific way. In this example, the infrastructure rules may dictate how patching subsystem 114 may determine patching schemes. In some embodiments, other architectures may exist for an infrastructure, causing patching subsystem 114 to determine patching schemes within the context of the architectural requirements. In some embodiments, computer system 102 (e.g., instruction generation subsystem 116) may generate cable patching instructions based on the determined patching scheme and may cause patching cables to be installed according to the cable patching instructions.

Figure 9:
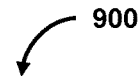
FIG. 9 shows first and second patching schemes, in accordance with one or more embodiments.

In some embodiments, patching subsystem 114 may determine cable patching schemes for patching one or more racks within an infrastructure. In some embodiments, a cable patching scheme may include connections between cable pairs of a multi-strand cable and interfaces of a rack. For example, FIG. 9 shows first and second patching schemes 900, in accordance with one or more embodiments. As shown in FIG. 9, the first and second patching schemes 900 may include patching scheme for a first side 902 (e.g., A-side rack) of a cable and patching scheme for a second side 906 (e.g., B-side) of the cable. In some embodiments, cable assembly 904 may include a cable ID 912, a cable type 914, and the patching schemes for the first side 902 and the second side 906. The patching scheme for the first side 902 may be based upon a first rack having a rack ID 908 and a rack type 910.

The patching scheme for the first side 902 may involve device 922 having an interface 928, a device 924 having an interface 930, and a device 926 having an interface 932. The patching scheme for the first side 902 may indicate which take of the cable (e.g., cable ID 912) will connect with each interface and device. For example, tail 934 may connect with interface 928 of device 922, tail 936 may connect with interface 930 of device 924, and tail 938 may connect with interface 932 of device 926. The tails may be identified by a number, name, color, or other identifier. In some embodiments, patching scheme for the second side 906 may be based upon a second rack having a rack ID 916 and a rack type 918.

The patching scheme for the second side 906 may involve device 952 having an interface 946, a device 954 having an interface 948, and a device 956 having an interface 950. The patching scheme for the second side 906 may indicate which take of the cable (e.g., cable ID 912) will connect with each interface and device. For example, tail 940 may connect with interface 946 or device 952, tail 942 may connect with interface 948 of device 954, and tail 944 may connect with interface 948 of device 956. The tails may be identified by a number, name, color, or other identifier.

In some embodiments, patching subsystem 114 may generate for display the first and second patching schemes 900 shown in FIG. 9. For example, presentation subsystem 120 may present the first and second patching schemes 900 to a user. The user may interact with the display (e.g., via user interaction subsystem 122). For example, the user may modify the patching schemes (e.g., to make corrections or modifications) or approve the patching scheme. In some embodiments, once the first and second patching schemes 900 have been finalized, instruction generation subsystem 116 may transmit an instruction comprising the first and second patching schemes 900 to a user device. Instruction generation subsystem 116 may transmit an instruction including the first and second patching schemes 900 to a cable patching machine. For example, a cable patching machine may be the same as or similar to the cable installation machine 400, as shown in FIG. 4. For example, the cable patching machine may receive the instructions with the first and second patching schemes 900 and may install patching cables according to the first and second patching schemes 900.

In some embodiments, patching subsystem 114 may determine new patching schemes by learning from existing patching schemes (e.g., via a prediction model). In some embodiments, patching subsystem 114 may determine available ports for one or more devices or objects in one or more racks and one or more required ports for patching the one or more devices or objects into the one or more racks. For example, the one or more devices may each require a certain number of patching connections and therefore may require a certain number and type of ports. In some embodiments, patching subsystem 114 may retrieve cable patching schemes for the one or more racks (e.g., from sensors 142, as shown in FIG. 1). Patching subsystem 114 may feed the available ports and the required ports into a prediction model as inputs and may feed the cable patching schemes into the prediction model as reference feedback. The prediction model may be configured based on the inputs and reference feedback. For example, the prediction model may learn how the one or more racks have been patched and may learn how to predict patching schemes. Subsequently, patching subsystem 114 may determine new available ports of new devices or objects in a new rack and new required ports for patching the new devices or objects into the new rack. Patching subsystem 114 may feed the new available ports and the new required ports into the prediction model to cause the prediction model to generate a predicted patching scheme for the new rack. In some embodiments, patching subsystem 114 or instruction generation subsystem 116 may transmit the patching scheme to a user device or a patching machine.

In some embodiments, patching subsystem 114 may determine new patching schemes by learning from existing patching schemes via a prediction model (e.g., such as a neural network). For example, patching subsystem 114 may receive a first rack type for a first rack. In some embodiments, a rack type may indicate a type of service that the rack delivers (e.g., server rack, patch rack, etc.). Patching subsystem 114 may determine, based on the first rack type, a first set of identifiers corresponding to available ports for devices or objects for the first rack. In some embodiments, patching subsystem 114 may compare the available ports for the devices or objects located in the first rack with a total number of ports for the devices or objects located in the first rack. For example, if the number of available ports for devices or objects located in the first rack is equal to the total number of ports for the devices or objects located in the first rack, patching subsystem may determine that the rack is empty. In another example, if the number of available ports for the devices or objects located in the first rack is less than the total number of ports for the devices or objects located in the first rack, patching subsystem may determine that the rack is partially full (e.g., already holds one or more objects). In some embodiments, patching subsystem 114 may categorize characteristics of the racks on which the prediction model is trained (e.g., empty racks vs. partially full racks) so that the prediction model may distinguish between patching schemes for empty racks and patching schemes for partially-full racks. Patching subsystem 114 may utilize the first set of identifiers corresponding to available ports for the devices or objects located in the first rack to assist the prediction model in predicting a patching scheme for the first rack.

In some embodiments, patching subsystem 114 may additionally receive a first set of cable patching codes for one or more devices to be patched into the first rack. In some embodiments, as previously described, the cable patching codes may assist patching subsystem 114 in understanding what type of object is in each rack. For example, cable patching codes may designate an object as a router, a network switch, or another object. In some embodiments, cable patching codes may designate interfaces on an object (e.g., an interface on a router, an interface on a network switch, or another interface). Patching subsystem 114 may determine, based on the first set of cable patching codes, a first set of ports required for patching the one or more devices. Patching subsystem 114 may utilize the first set of ports required for patching the one or more devices to assist the prediction model in predicting a patching scheme for patching the first rack.

In some embodiments, patching subsystem 114 may train or configure a prediction model to facilitate the determination of cable patching schemes. In some embodiments, patching subsystem 114 may generate an input for the neural network that includes the first set of identifiers corresponding to available ports for the devices or objects located in the first rack and the first set of ports required for patching the one or more devices or objects. For example, the neural network may require that inputs be in the form of vectors. Therefore, patching subsystem 114 may generate a vector comprising the first set of identifiers corresponding to available ports for the devices or objects located in the first rack and the first set of ports required for patching the one or more devices or objects. Patching subsystem 114 may then feed the vector into the neural network. Patching subsystem 114 may predict a first cable patching scheme for the first rack based on the first set of identifiers corresponding to available ports for the devices or objects located in the first rack and the first set of ports required for patching the one or more devices or objects.

Figure 10:
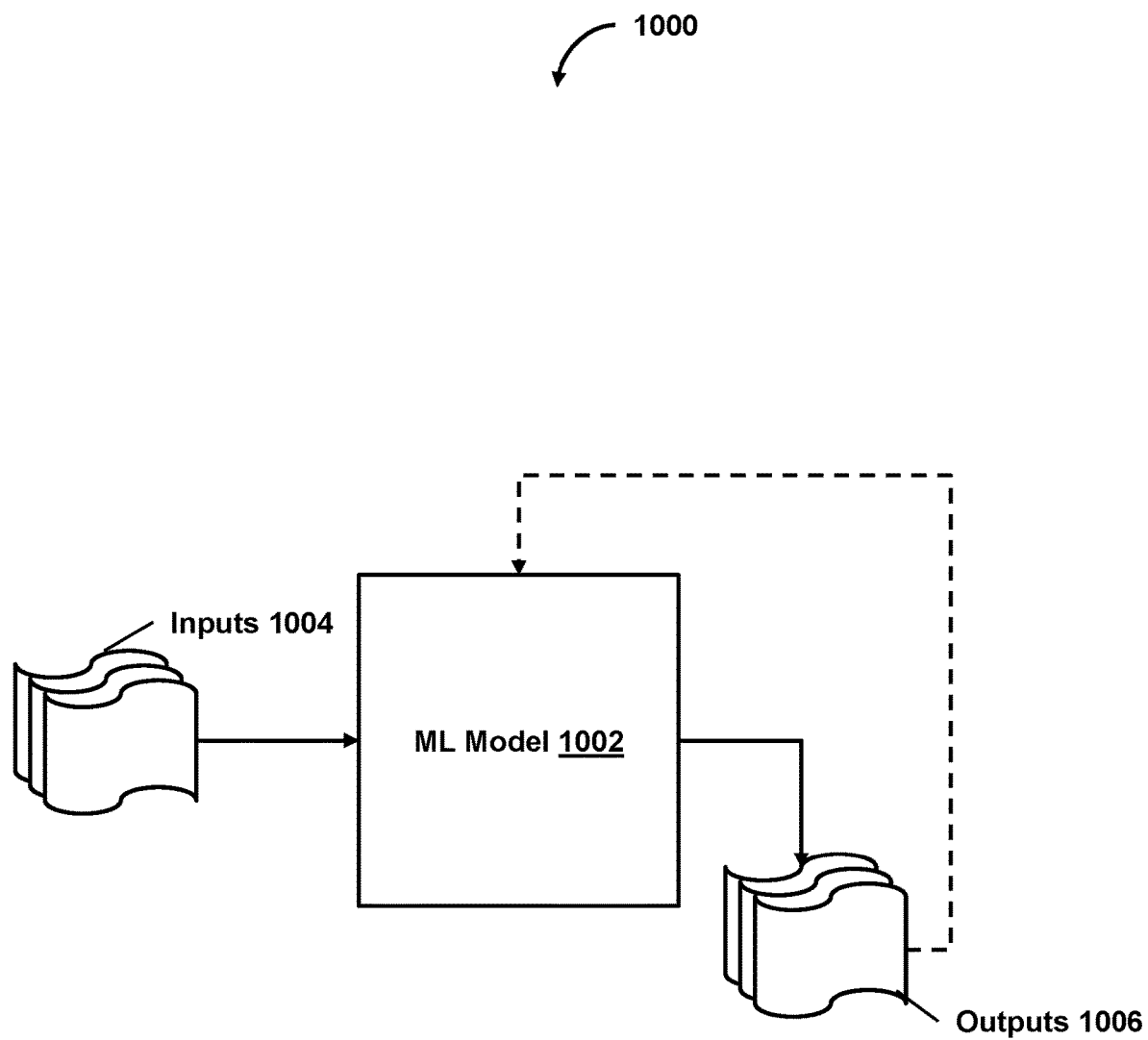
FIG. 10 shows a machine learning model configured to facilitate cable installation, in accordance with one or more embodiments.

The prediction model may learn to predict cable patching schemes. For example, the prediction model may include one or more neural networks or other machine learning models. FIG. 10 shows a machine learning model system 1000 configured to facilitate the determination of cable tray capacity, in accordance with one or more embodiments. As an example, neural networks may be based on a large collection of neural units (or artificial neurons). Neural networks may loosely mimic the manner in which a biological brain works (e.g., via large clusters of biological neurons connected by axons). Each neural unit of a neural network may be connected with many other neural units of the neural network. Such connections can be enforcing or inhibitory in their effect on the activation state of connected neural units. In some embodiments, each individual neural unit may have a summation function which combines the values of all its inputs together. In some embodiments, each connection (or the neural unit itself) may have a threshold function such that the signal must surpass the threshold before it propagates to other neural units. These neural network systems may be self-learning and trained, rather than explicitly programmed, and can perform significantly better in certain areas of problem solving, as compared to traditional computer programs. In some embodiments, neural networks may include multiple layers (e.g., where a signal path traverses from front layers to back layers). In some embodiments, back propagation techniques may be utilized by the neural networks, where forward stimulation is used to reset weights on the "front" neural units. In some embodiments, stimulation and inhibition for neural networks may be more free flowing, with connections interacting in a more chaotic and complex fashion.

Patching subsystem 114 may receive, from the neural network, a first predicted cable patching scheme for patching the one or more devices into the first rack. For example, the neural network may process the first vector to generate the first predicted cable patching scheme. The first predicted cable patching scheme may include a first set of predicted connections between a first set of cable pairs of a first multi-strand cable and a first set of interfaces of the first rack. The prediction model may update its configurations (for example, weights, biases, or other parameters) based on an assessment of its prediction. In some embodiments, patching subsystem 114 may retrieve, from one or more sensors, a first cable patching scheme for the first rack. The first cable patching scheme may include a first set of connections between the first set of cable pairs of the first multi-strand cable and the first set of interfaces of the first rack. Patching subsystem 114 may provide the first cable patching scheme as reference feedback to the neural network, causing the neural network to be trained based on an assessment of the first predicted cable patching scheme against the first cable patching scheme.

As an example, with respect to FIG. 10, machine learning model 1002 may take inputs 1004 and provide outputs 1006. In one use case, outputs 1006 may be fed back (for example, active feedback) to machine learning model 1002 as input to train machine learning model 1002 (e.g., alone or in conjunction with user indications of the accuracy of outputs 1006, labels associated with the inputs, or with other reference feedback information). In another use case, machine learning model 1002 may update its configurations (e.g., weights, biases, or other parameters) based on its assessment of its prediction (e.g., the first predicted cable patching scheme) and reference feedback information (e.g., the first cable patching scheme for the first rack). In another use case, where machine learning model 1002 is a neural network, connection weights may be adjusted to reconcile differences between the neural network's prediction and the reference feedback. In a further use case, one or more neurons (or nodes) of the neural network may require that their respective errors are sent backward through the neural network to them to facilitate the update process (e.g., backpropagation of error). Updates to the connection weights may, for example, be reflective of the magnitude of error propagated backward after a forward pass has been completed. In this way, for example, the machine learning model 1002 may be trained to generate better predictions. Database 132 (e.g., as shown in FIG. 1) may include training data and one or more trained prediction models.

In some embodiments, patching subsystem 114 may configure a prediction model (e.g., a neural network), as described above, such that the prediction model is trained to predict cable patching schemes for racks. In some embodiments, once the prediction model has been configured, patching subsystem 114 may cause the prediction model to predict a second cable patching scheme for a second rack. For example, patching subsystem 114 may receive a second rack type for the second rack and a second set of cable patching codes for one or more other devices to be patched into the second rack. In some embodiments, patching subsystem 114 may determine, based on the second rack type and the second set of cable patching codes, the second set of identifiers corresponding to the available ports for other devices or objects located in the second rack and the second set of ports required for patching the one or more other devices or objects into the second rack. Patching subsystem 114 may generate a second vector comprising a second set of identifiers corresponding to available ports for other devices or objects located in the second rack and a second set of ports required for patching second devices or objects into the second rack. Patching subsystem 114 may input the second vector into the neural network and receive, from the neural network, a second predicted cable patching scheme for patching the second rack. The neural network may determine the second predicted cable patching scheme based on the second vector. The second predicted cable patching scheme may include a second set of predicted connections between a second set of cable pairs of a second multi-strand cable and a second set of interfaces of the second rack. In some embodiments, system 100 may transmit, to a user device, the second predicted cable patching scheme for patching the second rack.

In some embodiments, once the patching for the second rack has been predicted, instruction generation subsystem 116 may transmit an instruction comprising the second predicted patching scheme to a user device. Instruction generation subsystem 116 may transmit an instruction comprising the second predicted patching scheme to a cable patching machine. For example, a cable patching machine may be the same as or similar to the cable installation machine 400, as shown in FIG. 4. For example, the cable patching machine may receive the instructions with the second predicted patching scheme and may install patching cables according to the second predicted patching scheme.

In some embodiments, once the patching schemes have been determined and the patching cables have been installed, patching subsystem 114 may obtain additional identifiers for the patching cables. For example, if the patching schemes involve custom manufactured cables, each cable may be associated with codes, names, descriptions, or other identifiers that describe the custom manufactured cable. In some embodiments, patching subsystem 114 may obtain the additional identifiers from a manufacturer of the custom cables. In some embodiments, patching subsystem 114 may obtain the additional identifiers when the patching cables are installed, for example, via a radio frequency transmission via Bluetooth, RFID, or NFC. In some embodiments, patching subsystem 114 may store the additional identifiers (e.g., with first and second patching schemes 900, as shown in FIG. 9) for future use, such as re-cabling or re-patching the racks.

Computer system 102 may utilize the determined patching schemes to facilitate cable installation in the aforementioned ways or in other ways. For example, the system may store information determined by patching subsystem 114 within data structures, such that the information is available to other systems. The system may use the patching scheme predictions to improve speed and efficiency of cable routing systems. The improved efficiency and accuracy of the cable patching methods described herein may, in turn, improve other aspects of the cable installation process.

Example Flowcharts

Figure 11:
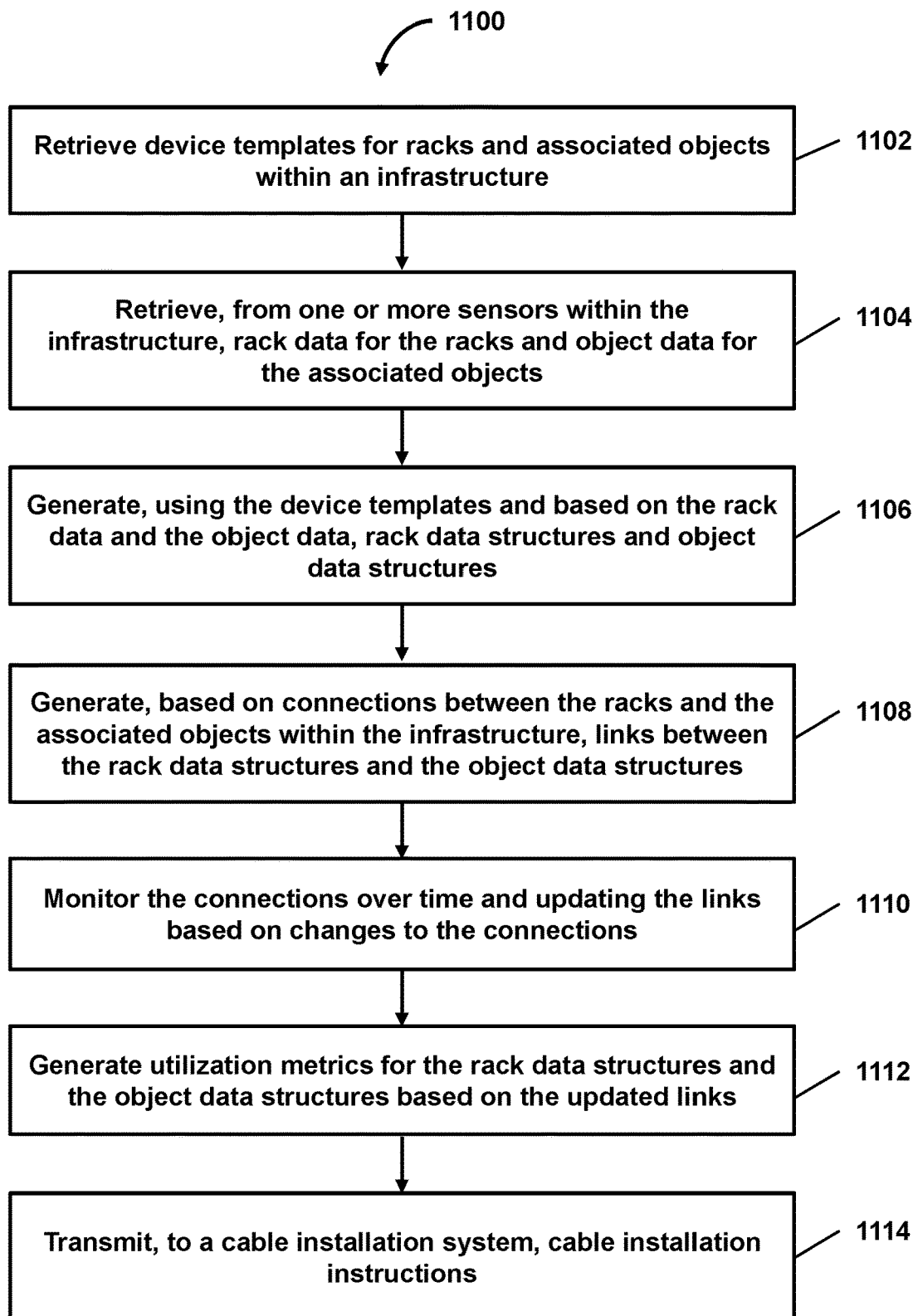
FIG. 11 shows a flowchart of a method for generating data structures and utilization metrics for racks to facilitate cable installation, in accordance with one or more embodiments.
Figure 12:
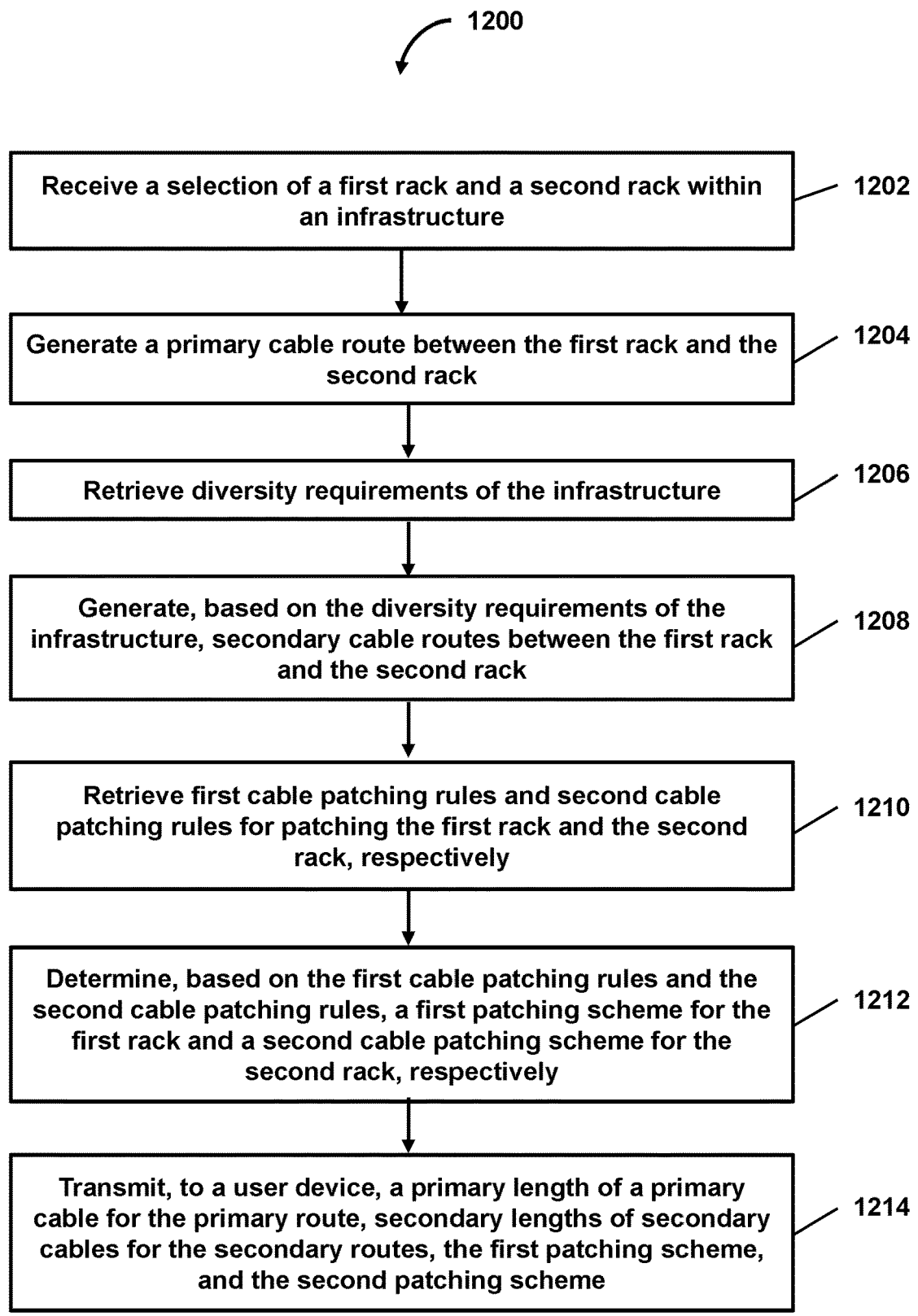
FIG. 12 shows a flowchart of a method for facilitating cable routing between racks, in accordance with one or more embodiments.
Figure 13:
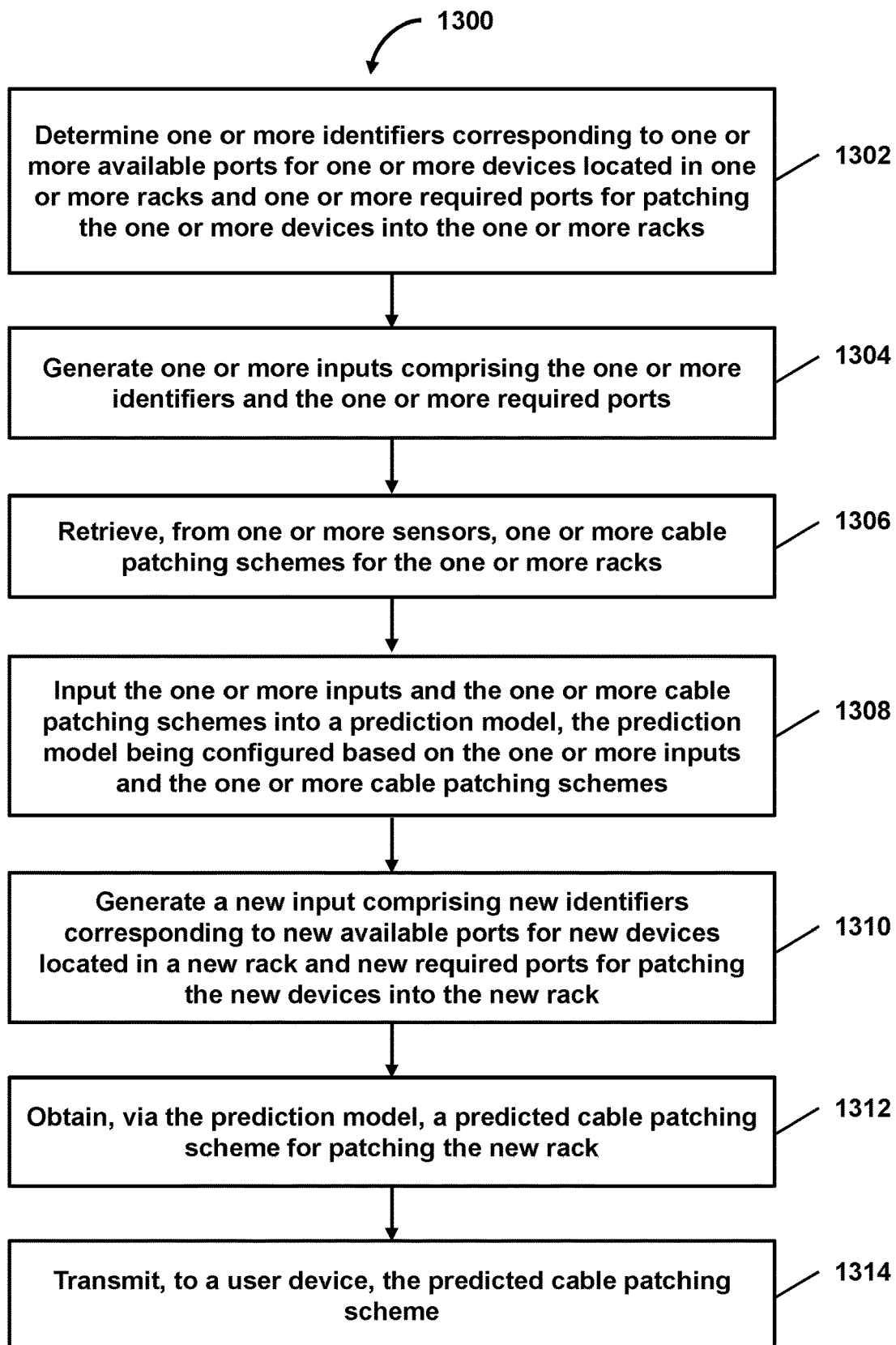
FIG. 13 shows a flowchart of a method for facilitating cable patching via a neural network, in accordance with one or more embodiments.

FIGS. 11-13 are example flowcharts of processing operations of methods that enable the various features and functionality of the system as described in detail above. The processing operations of each method presented below are intended to be illustrative and non-limiting. In some embodiments, for example, the methods may be accomplished with one or more additional operations not described, and/or without one or more of the operations discussed. Additionally, the order in which the processing operations of the methods are illustrated (and described below) is not intended to be limiting.

The methods may be implemented in one or more processing devices (e.g., a digital processor, an analog processor, a digital circuit designed to process information, an analog circuit designed to process information, a state machine, and/or other mechanisms for electronically processing information). The processing devices may include one or more devices executing some or all of the operations of the methods in response to instructions stored electronically on an electronic storage medium. The processing devices may include one or more devices configured through hardware, firmware, and/or software to be specifically designed for execution of one or more of the operations of the methods.

FIG. 11 shows a flowchart of a method 1100 for generating data structures and utilization metrics for racks to facilitate cable installation, in accordance with one or more embodiments.

In an operation 1102, device templates are retrieved for racks and objects associated with the racks within an infrastructure. The device templates may be data structures having empty fields or default values. The template may be specific to the type of device. For example, rack templates may be retrieved for racks and object data structures may be retrieved for objects. The device templates may further include computer instructions for generating data structures using identifier information, interface information, and patch reference information. In some embodiments, operation 1102 may be performed by a subsystem that is the same as or similar to data structure generation subsystem 110, in accordance with one or more embodiments.

In an operation 1104, rack data for the racks and object data for the associated objects may be retrieved from one or more sensors within the infrastructure. For example, the sensors may be cameras, scanners, scales, or other sensors. The rack data and object data may include identifier information, interface information, and patch reference information associated with racks and objects within the infrastructure. In some embodiments, values corresponding to field identifiers within device template may be identified. For example, the data may be identified based on formatting of the data, or the retrieved data may include identifiers that specify the type of data. In some embodiments, operation 1104 may be performed by a subsystem that is the same as or similar to data structure generation subsystem 110, in accordance with one or more embodiments.

In an operation 1106, rack data structures and object data structures may be generated using the device templates and based on the rack data and the object data. For example, the device templates may be recreated with populated or updated fields based on the rack data and the object data. The fields may be populated or updated with values, from the rack data and the object data, that correspond to the fields. For example, the fields may be populated or updated with the identifier information, interface information, and patch reference information associated with the racks and objects. In some embodiments, operation 1106 may be performed by a subsystem that is the same as or similar to data structure generation subsystem 110, in accordance with one or more embodiments.

In an operation 1108, links between the rack data structures and the object data structures may be generated. For example, the links may be generated based on connections between the racks and the associated objects. The connections may be physical connections. For example, a link may be generated between a rack and a router based on the router being located within the rack. In some embodiments, links may be generated based on racks or objects being physically connected via cabling. The links may be pointers, within the data structures, to other data structures. In some embodiments, a mapping of the connections may be generated and the links may be generated based on the mapping. In some embodiments, operation 1108 may be performed by a subsystem that is the same as or similar to data structure generation subsystem 110, in accordance with one or more embodiments.

In an operation 1110, the connections may be monitored over time and the links may be updated based on changes to the connections. For example, if connected devices become unconnected or moved, the links may be updated to reflect the changes. In some embodiments, operation 1110 may be performed by a subsystem that is the same as or similar to data structure generation subsystem 110, in accordance with one or more embodiments.

In an operation 1112, utilization metrics may be generated based on the updated links. For example, the utilization metrics may be for the rack data structures and the object data structures. In some embodiments, utilization metrics may indicate available interfaces and occupied interfaces. For example, available interfaces may indicate unused ports that are available for physical connections. In some embodiments, occupied interfaces may indicate used ports that are not available for physical connections. In some embodiments, utilization metrics for racks may indicate a portion or percent of the rack's capacity (e.g., by volume or by weight) that is full. In some embodiments, operation 1112 may be performed by a subsystem that is the same as or similar to data structure generation subsystem 110, in accordance with one or more embodiments.

In an operation 1114, cable installation instructions may be transmitted to a cable installation system. For example, the cable installation instructions may be generated based on cable installation instructions based on the rack data structures, the object data structures, and the utilization metrics. The cable installation instructions may be based on information included in the utilization metrics that indicates locations for additional physical connections. The cable installation instructions may include instructions for connecting cables with available ports or interfaces of the objects within the infrastructure. For example, the instructions may specify specific cable ends or pairs to be connected with specific ports or interfaces. The cable installation instructions may account for rack utilization (e.g., by volume or by weight), port or interface utilization, and other types of rack and object utilization. The cable installation system may be a system that instructs a person installing cables within an infrastructure. The cable installation system may be a cable installation machine (e.g., a robotic installer) that executes the instructions. In some embodiments, operation 1114 may be performed by a subsystem that is the same as or similar to instruction generation subsystem 116, in accordance with one or more embodiments.

FIG. 12 shows a flowchart of a method 1200 for facilitating cable routing between racks, in accordance with one or more embodiments.

In an operation 1202, a selection of a first rack and a second rack within an infrastructure may be received. For example, the selection may be received from a user (e.g., via a user interface). The first rack may be selected from a first set of racks that meet first rack requirements and the second rack may be selected from a second set of racks that meet second requirements. The selection may include multiple second racks from the second set of racks. The rack requirements may be based on a cable connecting the first rack with the second rack (e.g., the cable may require certain ports or interfaces). The rack requirements may stipulate rack types for the first rack and the second rack. The rack requirements may stipulate one or more objects that must be associated with the first rack or the second rack. The rack requirements may stipulate other requirements for the first rack or the second rack. In some embodiments, operation 1202 may be performed by a subsystem that is the same as or similar to routing subsystem 112, in accordance with one or more embodiments.

In an operation 1204, a primary cable route may be generated between the first rack and the second rack. For example, the primary cable route may be an optimal route between the first rack and the second rack. The optimal route may be determined based on distance, density, maximum capabilities, diversity requirements for cabling, other factors, or any combination of factors. The optimal route may be the most compliant route to the second rack with respect to standards, regulations, safety precautions, internal guidelines, or other guidelines. The optimal route may be the most cost-efficient route to each second route (i.e., using the least materials or requiring the least manpower for installation). In some embodiments, operation 1204 may be performed by a subsystem that is the same as or similar to routing subsystem 112, in accordance with one or more embodiments.

In an operation 1206, diversity requirements for the infrastructure may be retrieved. For example, diversity requirements may be alternative routes connecting the first rack with the second rack or second racks such that potential damage to any one cable, still provides alternate pathways to the second rack or racks. For example, diversity requirements may stipulate a certain number of secondary routes that are required for each primary route. In some embodiments, diversity requirements may stipulate attributes of the secondary routes. For example, the diversity requirements may require that the secondary routes do not overlap with each other or with the primary route or that the secondary routes have less than a certain number of nodes in common with each other. The diversity requirements may include any other required attributes of the secondary routes or a combination of required attributes. The diversity requirements may be specific to the infrastructure, the client, the area, some other factor, or a combination of factors. In some embodiments, operation 1206 may be performed by a subsystem that is the same as or similar to routing subsystem 112, in accordance with one or more embodiments.

In an operation 1208, secondary cable routes may be generated based on the diversity requirements. The secondary routes may connect the first rack with the second rack along different routes than the primary cable route. In some embodiments, a combination of secondary paths that is the most optimal and that meets all diversity requirements may be generated. In some embodiments, operation 1208 may be performed by a subsystem that is the same as or similar to routing subsystem 112, in accordance with one or more embodiments.

In an operation 1210, first cable patching rules and second cable patching rules may be retrieved for patching the first rack and the second rack, respectively. The cable patching rules may be retrieved (e.g., from database 132). In some embodiments, cable patching rules that have been predetermined based on the devices within the infrastructure may be retrieved. For example, the cable patching rules may depend on rack types of the first rack and the second rack. The cable patching rules may depend on cable patching codes associated with objects being patched into the first rack and the second rack. The cable patching rules may depend on other factors or a combination of factors. The cable patching rules may include one or more logic configurations. For example, logic configurations may stipulate that cables may be added based on certain conditions (e.g., always, service type, leaf number, spine size, spine number, etc.). The logic configurations may be preconfigured. The cable patching rules may be received as input from a user. In some embodiments, operation 1210 may be performed by a subsystem that is the same as or similar to routing subsystem 112, in accordance with one or more embodiments.

In an operation 1212, a first cable patching scheme for the first rack and a second cable patching scheme for the second rack may be determined. For example, the first cable patching scheme and the second cable patching scheme may be determined based on the first cable patching rules and the second cable patching rules. For example, the cable patching rules may be analyzed against cable patching codes corresponding to the first and second racks. For example, cable patching codes corresponding to the first and second racks or objects within the first and second racks may be retrieved from data structures associated with the first and second racks or objects within the first and second racks. The cable patching codes may assist in determining the objects that require patching and what ports or interfaces are required for the patching. The cable patching codes may be compared with the cable patching rules to determine whether conditions of the cable patching rules are satisfied. For example, a rule may stipulate that a patching cable should be added when a certain condition is satisfied (e.g., always or based on service type, leaf number, spine size, spine number, etc.). The cable patching codes retrieved from the data structures may be analyzed and it may be determined whether the condition of the patching rule is satisfied. In some embodiments, if the condition is satisfied, add one or more patching cables may be added to the cable patching scheme. In some embodiments, operation 1212 may be performed by a subsystem that is the same as or similar to patching subsystem 114, in accordance with one or more embodiments.

In an operation 1214, a primary length of a primary cable for the primary route, secondary lengths of secondary cables for the secondary routes, the first patching scheme, and the second patching scheme may be transmitted to a user device. The primary length of the primary cable for the primary route, the secondary lengths of the secondary cables for the secondary routes, the first patching scheme, and the second patching scheme may be transmitted to a vendor (e.g., as an order). The primary length of the primary cable for the primary route, the secondary lengths of the secondary cables for the secondary routes, the first patching scheme, and the second patching scheme may be transmitted to a manufacturer (e.g., to be manufactured). In some embodiments, operation 1214 may be performed by a subsystem that is the same as or similar to instruction generation subsystem 116, in accordance with one or more embodiments.

FIG. 13 shows a flowchart of a method 1300 for facilitating cable patching via a neural network, in accordance with one or more embodiments.

In an operation 1302, one or more identifiers and one or more required ports may be determined. The one or more identifiers may correspond to one or more available ports for devices or objects located in one or more racks, and the one or more required ports may be required for patching the devices or objects into the one or more racks. The one or more identifiers may be determined based on the types of the one or more racks. The one or more devices may each require a certain number of patching connections and therefore may require a certain number and type of ports. In some embodiments, operation 1302 may be performed by a subsystem that is the same as or similar to patching subsystem 114, in accordance with one or more embodiments.

In an operation 1304, one or more inputs may be generated. For example, the inputs may include the one or more identifiers and the one or more required ports. The inputs may be vectors. For example, certain prediction models may require that inputs be in the form of vectors. In some embodiments, operation 1304 may be performed by a subsystem that is the same as or similar to patching subsystem 114, in accordance with one or more embodiments.

In an operation 1306, one or more cable patching schemes for the one or more racks may be retrieved. For example, the one or more cable patching schemes may be retrieved from sensors within the infrastructure. In other words, the one or more cable patching schemes may include connections between cable pairs of a multi-strand cable and interfaces of the one or more racks. In some embodiments, operation 1306 may be performed by a subsystem that is the same as or similar to patching subsystem 114, in accordance with one or more embodiments.

In an operation 1308, the one or more inputs and the one or more cable patching schemes may be input into a prediction model. The prediction model may be configured based on the one or more inputs and the one or more cable patching schemes. The prediction model may update its configurations (e.g., weights, biases, or other parameters) based on its assessment of its prediction (e.g., the first predicted cable patching scheme) and reference feedback information (e.g., the first cable patching scheme for the first rack). The prediction model may be a neural network or another type of machine learning model. where machine learning model 1002 is a neural network, connection weights may be adjusted to reconcile differences between the neural network's prediction and the reference feedback. In some embodiments, one or more neurons (or nodes) of the neural network may require that their respective errors are sent backward through the neural network to them to facilitate the update process (e.g., backpropagation of error). Updates to the connection weights may, for example, be reflective of the magnitude of error propagated backward after a forward pass has been completed. In this way, for example, the neural network may be trained to generate better predictions. In some embodiments, operation 1308 may be performed by a subsystem that is the same as or similar to patching subsystem 114, in accordance with one or more embodiments.

In an operation 1310, a new input may be generated comprising new identifiers corresponding to new available ports for new devices or objects located in a new rack and new required ports for patching the new devices or objects into the new rack. In some embodiments, operation 1310 may be performed by a subsystem that is the same as or similar to patching subsystem 114, in accordance with one or more embodiments. In an operation 1312, a predicted cable patching scheme for patching the new rack may be obtained via the configured prediction model. For example, the predicted cable patching scheme may include prediction connections between cable pairs of new multi-strand cable and new interfaces of the new racks. In some embodiments, operation 1312 may be performed by a subsystem that is the same as or similar to patching subsystem 114, in accordance with one or more embodiments.

In an operation 1314, the predicted cable patching scheme may be transmitted to a user device. The predicted cable patching scheme may be transmitted to a cable patching system. The cable patching system may be a system that instructs a person installing patching cables within an infrastructure. The cable patching system may be a cable patching machine (e.g., a robotic installer) that executes cable patching instructions. In some embodiments, operation 1314 may be performed by a subsystem that is the same as or similar to instruction generation subsystem 116, in accordance with one or more embodiments.

The various computers and subsystems illustrated in FIG. 1 may include one or more computing devices that are programmed to perform the functions described herein. The computing devices may include one or more electronic storages (e.g., database(s) 132), one or more physical processors programmed with one or more computer program instructions, and/or other components. The computing devices may include communication lines or ports to enable the exchange of information within a network (e.g., network 150) or other computing platforms via wired or wireless techniques (e.g., Ethernet, fiber optics, coaxial cable, Wi-Fi, Bluetooth, near field communication, or other technologies). The computing devices may include a plurality of hardware, software, and/or firmware components operating together. For example, the computing devices may be implemented by a cloud of computing platforms operating together as the computing devices.

The electronic storages may include non-transitory storage media that electronically stores information. The storage media of the electronic storages may include one or both of (i) system storage that is provided integrally (e.g., substantially non-removable) with servers or client devices or (ii) removable storage that is removably connectable to the servers or client devices via, for example, a port (e.g., a USB port, a firewire port, etc.) or a drive (e.g., a disk drive, etc.). The electronic storages may include one or more of optically readable storage media (e.g., optical disks, etc.), magnetically readable storage media (e.g., magnetic tape, magnetic hard drive, floppy drive, etc.), electrical charge-based storage media (e.g., EEPROM, RAM, etc.), solid-state storage media (e.g., flash drive, etc.), and/or other electronically readable storage media. The electronic storages may include one or more virtual storage resources (e.g., cloud storage, a virtual private network, and/or other virtual storage resources). The electronic storage may store software algorithms, information determined by the processors, information obtained from servers, information obtained from client devices, or other information that enables the functionality as described herein.

The processors may be programmed to provide information processing capabilities in the computing devices. As such, the processors may include one or more of a digital processor, an analog processor, a digital circuit designed to process information, an analog circuit designed to process information, a state machine, and/or other mechanisms for electronically processing information. In some embodiments, the processors may include a plurality of processing units. These processing units may be physically located within the same device, or the processors may represent processing functionality of a plurality of devices operating in coordination. The processors may be programmed to execute computer program instructions to perform functions described herein of subsystems 110-122, 142-146, or other subsystems. The processors may be programmed to execute computer program instructions by software; hardware; firmware; some combination of software, hardware, or firmware; and/or other mechanisms for configuring processing capabilities on the processors.

It should be appreciated that the description of the functionality provided by the different subsystems 110-122 and 142-146 described herein is for illustrative purposes, and is not intended to be limiting, as any of subsystems 110-122 and 142-146 may provide more or less functionality than is described. For example, one or more of subsystems 110-122 and 142-146 may be eliminated, and some or all of its functionality may be provided by other ones of subsystems 110-122 and 142-146. As another example, additional subsystems may be programmed to perform some or all of the functionality attributed herein to one of subsystems 110-122 and 142-146.

Although the present invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the scope of the appended claims. For example, it is to be understood that the present invention contemplates that, to the extent possible, one or more features of any embodiment can be combined with one or more features of any other embodiment.

The present patent filing is one of a set of three applications filed on the same day by the same applicant. These patent filings have the following titles: DATA STRUCTURE AND UTILIZATION METRIC GENERATION FOR FACILITATING CABLE INSTALLATION (U.S. patent application Ser. No. 17/180,342), INTELLIGENT CABLE ROUTING BETWEEN RACKS TO FACILITATE CABLE INSTALLATION (U.S. patent application Ser. No. 17/180,371), and INTELLIGENT CABLE PATCHING OF RACKS TO FACILITATE CABLE INSTALLATION (the present application). The entire contents of each of the patent filings other than this one is hereby incorporated by reference.

The present techniques will be better understood with reference to the following enumerated embodiments:

1. A method comprising: retrieving device templates for racks and associated objects within an infrastructure; receiving, from one or more sensors within the infrastructure, rack data for the racks and object data for the associated objects; and generating, using the device templates and based on the rack data and the object data, rack data structures and object data structures.

2. The method of embodiment 1, further comprising: generating, based on connections between the racks and the associated objects within the infrastructure, links between the rack data structures and the object data structures; monitoring the connections over time and updating the links based on changes to the connections; and generating utilization metrics for the rack data structures and the object data structures based on the updated links.

3. The method of any of the preceding embodiments, further comprising: transmitting, to a cable installation system, cable installation instructions based on the rack data structures, the object data structures, and the utilization metrics.

4. The method of any of the preceding embodiments, wherein generating the rack data structures and the object data structures comprises: retrieving, from the device templates, identifiers or formats associated with fields of the device templates; identifying, within the rack data and the object data, values corresponding to the fields of the device templates based on the identifiers or the formats associated with the fields; and linking the values with the fields of the device templates.

5. The method of any of the preceding embodiments, further comprising: analyzing the rack data retrieved from the one or more sensors and the object data retrieved from the one or more sensors; and determining the connections between the racks and the associated objects within the infrastructure based on the rack data and the object data.

6. The method of any of the preceding embodiments, wherein generating the links between the rack data structures and the object data structures comprises: generating, based on (i) the connections, (ii) the rack data, and (iii) the object data, a mapping between the rack data structures and the object data structures; and generating, based on the mapping, pointers within the rack data structures and the object data structures, each pointer indicating particular rack data structure or a particular object data structure.

7. The method of any of the preceding embodiments, wherein the device templates comprise computer instructions for the generating of the rack data structures and the object data structures using identifier information, interface information, and patch reference information.

8. The method of embodiment 7, wherein the rack data and the object data comprise the identifier information, the interface information, and the patch reference information, the identifier information comprising identifiers of the racks and the associated objects, the interface information indicating interfaces of the racks and the associated objects, and the patch reference information comprising cable patching codes for the racks and the associated objects.

9. The method of any of the preceding embodiments, wherein the utilization metrics indicate locations for additional connections.

10. The method of embodiment 9, further comprising generating, based on the rack data structures, the object data structures, and the utilization metrics, the cable installation instructions comprising the locations for the additional connections.

11. A method comprising: receiving a selection of a first rack and a second rack within an infrastructure; generating a primary cable route between the first rack and the second rack, wherein the primary cable route is an optimal route between the first rack and the second rack, the primary cable route having a primary cable route length; retrieving diversity requirements of the infrastructure, the diversity requirements comprising (i) a required number of secondary cable routes between the first rack and the second rack for secondary master cables and (ii) required attributes of the secondary cable routes between the first rack and the second rack; generating, based on the diversity requirements of the infrastructure, secondary cable routes between the first rack and the second rack, the secondary cable routes having secondary route lengths; transmitting, to a user device, the primary cable route length and the secondary cable route lengths.

12. The method of embodiment 11, further comprising: retrieving first cable patching rules and second cable patching rules for patching the first rack and the second rack, respectively; determining, based on the first cable patching rules, a first patching scheme for the first rack, wherein the first patching scheme comprises a first patching length and a first cable type; determining, based on the second cable patching rules, a second patching scheme for the second rack, wherein the second patching scheme comprises a second patching length and a second cable type; and transmitting, to the user device, the first patching scheme and the second patching scheme.

13. The method of any of the preceding embodiments, further comprising: retrieving first rack requirements for a first end of master cables and second rack requirements for a second end of the master cables; retrieving, from rack data structures, classification information and interface information for racks within the infrastructure; generating for display (i) a first set of racks that meet the first rack requirements based on the classification information and the interface information of the racks and (ii) a second set of racks that meet the second rack requirements based on the classification information and the interface information of the racks; and receiving, from a user, the selection of the first rack from the first set of racks and the second rack from the second set of racks.

14. The method of embodiment 13, wherein retrieving the classification information and the interface information for the racks within the infrastructure comprises retrieving the classification information and the interface information for the racks from rack data structures.

15. The method of any of the preceding embodiments, wherein the first cable patching rules and the second cable patching rules comprise cable requirements for the first patching scheme for the first rack and for the second patching scheme for the second rack, respectively.

16. The method of embodiment 15, wherein determining the first patching scheme for the first rack and the second patching scheme for the second rack comprises selecting, based on the first cable patching rules and the second cable patching rules, first patching cables and second patching cables, respectively.

17. The method of any of the preceding embodiments, further comprising: determining a primary cable type for the primary cable route; and determining secondary cable types for the secondary cable routes.

18. The method of any of the preceding embodiments, further comprising: receiving, from the user device, installation data indicating cables that have been installed within for the primary cable route, the secondary cable routes, the first patching scheme, or the second patching scheme; and storing, based on the installation data, an installation progress.

19. The method of embodiment 18, further comprising: retrieving the stored installation progress; and generating for display the first rack and the second rack with an indication of the installation progress.

20. A method comprising: determining one or more identifiers corresponding to one or more available ports for one or more devices located in one or more racks and one or more required ports for patching the one or more devices into the one or more racks; generating one or more inputs comprising the one or more identifiers and the one or more required ports; retrieving, from one or more sensors, one or more cable patching schemes for the one or more racks; and inputting the one or more inputs and the one or more cable patching schemes into a prediction model, the prediction model being configured based on the one or more inputs and the one or more cable patching schemes.

21. The method of embodiment 20, further comprising: generating a new input comprising new identifiers corresponding to new available ports for new devices located in a new rack and new required ports for patching the new devices into the new rack; obtaining, via the prediction model, a predicted cable patching scheme for patching the new rack, wherein the prediction model determines the predicted cable patching scheme based on the new input; and transmitting, to a user device, the predicted cable patching scheme.

22. The method of any of the preceding embodiments, wherein determining the one or more identifiers corresponding to the one or more available ports for the one or more devices located in the one or more racks and the one or more required ports for patching the one or more devices into the one or more racks comprises: receiving one or more rack types for the one or more racks and one or more cable patching codes for the one or more devices to be patched into the one or more racks; determining the one or more identifiers corresponding to the one or more available ports for the one or more devices located in the one or more racks based on the one or more rack types; and determining the one or more required ports for patching the one or more devices into the one or more racks based on the one or more cable patching codes for the one or more devices.

23. The method of any of the preceding embodiments, further comprising: receiving a new rack type for the new rack and new patching codes for the new devices to be patched into the new rack; determining the new identifiers corresponding to the new available ports for new devices located in the new rack based on the new rack type; and determining the new required ports for patching the new devices into the new rack based on the new patching codes for the new devices.

24. The method of any of the preceding embodiments, wherein the predicted cable patching scheme comprises predicted connections between cable pairs of a multi-strand cable and interfaces of the new rack.

25. The method of embodiment 24, wherein the predicted cable patching scheme comprises identifiers of the cable pairs that will connect with the interfaces of the new rack, wherein the identifiers comprise one or more of tail colors, numbers, and names of the cable pairs.

26. The method of embodiment 25, further comprising obtaining the identifiers of the cable pairs via a radio frequency transmission using at least one of Bluetooth, RFID, and NFC.

27. The method of any of the preceding embodiments, wherein: the one or more inputs comprise one or more vectors comprising the one or more identifiers and the one or more required ports; and the new input comprises a new vector comprising the new identifiers and the new required ports.

28. The method of any of the preceding embodiments, further comprising: retrieving, from the one or more sensors, port availability data for the new devices located in the new rack, wherein the port availability data indicates which ports of the new devices located in the new rack are available and which ports of the new devices located in the new rack are unavailable; and modifying, based on the port availability data, the new identifiers corresponding to the new available ports of the new devices located in the new rack.

29. A tangible, non-transitory, computer-readable medium storing instructions that, when executed by a data processing apparatus, cause the data processing apparatus to perform operations comprising those of any of embodiments 1-28.

30. A system comprising: one or more processors; and memory storing instructions that, when executed by the processors, cause the processors to effectuate operations comprising those of any of embodiments 1-28.

What is claimed is:

1. A system for facilitating cable patching via a neural network, the system comprising:
one or more processors configured to process computer program instructions that, when executed by the one or more processors, cause the one or more processors to perform operations comprising:
receiving a first rack type for a first rack and a first set of cable patching codes for one or more devices located in the first rack;
determining, based on the first rack type and the first set of cable patching codes, a first set of identifiers corresponding to available ports for the one or more devices located in the first rack and a first set of ports required for patching the one or more devices;
generating a first vector comprising the first set of identifiers and the first set of ports;
inputting the first vector into a neural network;
receiving, from the neural network, a first predicted cable patching scheme for patching the one or more devices into the first rack, wherein the neural network processes the first vector to generate the first predicted cable patching scheme;
retrieving, from one or more sensors, a first cable patching scheme for the first rack;
providing the first cable patching scheme as reference feedback to the neural network, wherein the neural network is trained based on assessing the first predicted cable patching scheme against the first cable patching scheme;
generating a second vector comprising a second set of identifiers and a second set of ports for a second rack;
inputting the second vector into the neural network;
receiving, from the neural network, a second predicted cable patching scheme for patching the second rack, wherein the neural network determines the second predicted cable patching scheme based on the second vector; and
transmitting, to a user device, the second predicted cable patching scheme for patching the second rack.

2. The system of claim 1, wherein:
the first predicted cable patching scheme comprises a first set of predicted connections between a first set of cable pairs of a first multi-strand cable and a first set of interfaces of the first rack;
the first cable patching scheme comprises a first set of connections between the first set of cable pairs of the first multi-strand cable and the first set of interfaces of the first rack; and
the second predicted cable patching scheme comprises a second set of predicted connections between a second set of cable pairs of a second multi-strand cable and a second set of interfaces of the second rack.

3. The system of claim 1, further comprising:
receiving a second rack type for the second rack and a second set of cable patching codes for one or more other devices located in the second rack;
determining, based on the second rack type and the second set of cable patching codes, the second set of identifiers corresponding to the available ports for the one or more other devices located in the second rack and the second set of ports required for patching the one or more other devices.

4. The system of claim 1, further comprising:
retrieving, from the one or more sensors, port availability data for the one or more devices located in the first rack, wherein the port availability data indicates which ports of the one or more devices in the first rack are available and which ports of the one or more devices in the first rack are unavailable; and
modifying, based on the port availability data, the first set of identifiers corresponding to the available ports of the one or more devices in the first rack.

5. A method executed by a computer, the method comprising:
determining one or more identifiers corresponding to one or more available ports for one or more devices located in one or more racks and one or more required ports for patching the one or more devices into the one or more racks;
generating one or more inputs comprising the one or more identifiers and the one or more required ports;
retrieving, from one or more sensors, one or more cable patching schemes for the one or more racks;
inputting the one or more inputs and the one or more cable patching schemes into a prediction model, the prediction model being configured based on the one or more inputs and the one or more cable patching schemes;
generating a new input comprising new identifiers corresponding to new available ports for new devices located in a new rack and new required ports for patching the new devices into the new rack;
obtaining, via the prediction model, a predicted cable patching scheme for patching the new rack, wherein the prediction model determines the predicted cable patching scheme based on the new input; and
transmitting, to a user device, the predicted cable patching scheme.

6. The method of claim 5, wherein determining the one or more identifiers corresponding to the one or more available ports for the one or more devices located in the one or more racks and the one or more required ports for patching the one or more devices into the one or more racks comprises:
receiving one or more rack types for the one or more racks and one or more cable patching codes for the one or more devices located in the one or more racks;
determining the one or more identifiers corresponding to the one or more available ports for the one or more devices located in the one or more racks based on the one or more rack types; and
determining the one or more required ports for patching the one or more devices into the one or more racks based on the one or more cable patching codes for the one or more devices.

7. The method of claim 5, further comprising:
receiving a new rack type for the new rack and new patching codes for the new devices located in the new rack;
determining the new identifiers corresponding to the new available ports for the new devices located in the new rack based on the new rack type; and
determining the new required ports for patching the new devices into the new rack based on the new patching codes for the new devices.

8. The method of claim 5, wherein the predicted cable patching scheme comprises predicted connections between cable pairs of a multi-strand cable and interfaces of the new rack.

9. The method of claim 8, wherein the predicted cable patching scheme comprises identifiers of the cable pairs that will connect with the interfaces of the new rack, wherein the identifiers comprise one or more of tail colors, numbers, and names of the cable pairs.

10. The method of claim 9, further comprising obtaining the identifiers of the cable pairs via a radio frequency transmission using at least one of Bluetooth, RFID, and NFC.

11. The method of claim 5, wherein:
the one or more inputs comprise one or more vectors comprising the one or more identifiers and the one or more required ports; and
the new input comprises a new vector comprising the new identifiers and the new required ports.

12. The method of claim 5, further comprising:
retrieving, from the one or more sensors, port availability data for the new devices located in the new rack, wherein the port availability data indicates which ports of the new devices located in the new rack are available and which ports of the new devices located in the new rack are unavailable; and
modifying, based on the port availability data, the new identifiers corresponding to the new available ports of the new devices located in the new rack.

13. One or more non-transitory, computer-readable media storing instructions that, when executed by one or more processors, effectuate operations comprising:
determining one or more identifiers corresponding to one or more available ports for one or more devices located in one or more racks and one or more required ports for patching the one or more devices into the one or more racks;
generating one or more inputs comprising the one or more identifiers and the one or more required ports;
retrieving, from one or more sensors, one or more cable patching schemes for the one or more racks;
inputting the one or more inputs and the one or more cable patching schemes into a prediction model, the prediction model being configured based on the one or more inputs and the one or more cable patching schemes;
generating a new input comprising new identifiers corresponding to new available ports for new devices located in a new rack and new required ports for patching the new devices into the new rack;
obtaining, via the prediction model, a predicted cable patching scheme for patching the new rack, wherein the prediction model determines the predicted cable patching scheme based on the new input; and
transmitting, to a user device, the predicted cable patching scheme.

14. The media of claim 13, wherein determining the one or more identifiers corresponding to the one or more available ports for the one or more devices located in the one or more racks and the one or more required ports for patching the one or more devices into the one or more racks comprises:
receiving one or more rack types for the one or more racks and one or more cable patching codes for the one or more devices located in the one or more racks;
determining the one or more identifiers corresponding to the one or more available ports for the one or more devices located in the one or more racks based on the one or more rack types; and determining the one or more required ports for patching the one or more devices into the one or more racks based on the one or more cable patching codes for the one or more devices.

15. The media of claim 13, further comprising:

receiving a new rack type for the new rack and new patching codes for the new devices located in the new rack;

determining the new identifiers corresponding to the new available ports for the new devices located in the new rack based on the new rack type; and determining the new required ports for patching the new devices into the new rack based on the new patching codes for the new devices.

16. The media of claim 13, wherein the predicted cable patching scheme comprises predicted connections between cable pairs of a multi-strand cable and interfaces of the new rack.

17. The media of claim 16, wherein the predicted cable patching scheme comprises identifiers of the cable pairs that will connect with the interfaces of the new rack, wherein the identifiers comprise one or more of tail colors, numbers, and names of the cable pairs.

18. The media of claim 17, further comprising obtaining the identifiers of the cable pairs via a radio frequency transmission using at least one of Bluetooth, RFID, and NFC.

19. The media of claim 13, wherein:

the one or more inputs comprise one or more vectors comprising the one or more identifiers and the one or more required ports; and the new input comprises a new vector comprising the new identifiers and the new required ports.

20. The media of claim 13, further comprising:

retrieving, from the one or more sensors, port availability data for the new devices located in the new rack, wherein the port availability data indicates which ports of the new devices located in the new rack are available and which ports of the new devices located in the new rack are unavailable; and modifying, based on the port availability data, the new identifiers corresponding to the new available ports of the new devices located in the new rack.

\* \* \* \* \*